US012751261B2

(12) United States Patent
Narkeviciute et al.

(10) Patent No.: US 12,751,261 B2
(45) Date of Patent: Sep. 29, 2026

(54) SELECTIVE DEPOSITION USING GRAPHENE AS AN INHIBITOR

(71) Applicant: Lam Research Corporation, Fremont, CA (US)

(72) Inventors: Ieva Narkeviciute, Portland, OR (US); Bhadri N. Varadarajan, Beaverton, OR (US); Kashish Sharma, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 566 days.

(21) Appl. No.: 18/002,043

(22) PCT Filed: Jun. 17, 2021

(86) PCT No.: PCT/US2021/037885
§ 371 (c)(1),
(2) Date: Dec. 15, 2022

(87) PCT Pub. No.: WO2021/262527
PCT Pub. Date: Dec. 30, 2021

(65) Prior Publication Data

US 2023/0245924 A1 Aug. 3, 2023

Related U.S. Application Data

(60) Provisional application No. 62/705,350, filed on Jun. 23, 2020.

(51) Int. Cl.
*H01L 21/768* (2006.01)
*C23C 16/26* (2006.01)
(Continued)

(52) U.S. Cl.
CPC ........... *H10W 20/075* (2026.01); *C23C 16/26* (2013.01); *C23C 16/403* (2013.01);
(Continued)

(58) Field of Classification Search
CPC ......... H01L 21/76832; H01L 21/76834; H01L 21/7685; H01L 21/76862; H01L 23/53238;
(Continued)

(56) References Cited

U.S. PATENT DOCUMENTS 5,110,577 A 5/1992 Tamor et al.
5,712,000 A 1/1998 Wei et al.
(Continued)

FOREIGN PATENT DOCUMENTS

CA 3113726 A1 6/2020
CN 102892922 A 1/2013
(Continued)

OTHER PUBLICATIONS

Boyd, et al., 'Single-step deposition of high-mobility graphene at reduced temperatures' Nature Comm., Mar. 18, 2015, pp. 1-8.
(Continued)

*Primary Examiner* — Christine S. Kim
*Assistant Examiner* — Nathalie R Fayette
(74) *Attorney, Agent, or Firm* — Weaver Austin Villeneuve & Sampson LLP

(57) ABSTRACT

Graphene is selectively deposited on a metal layer relative to a dielectric layer of a semiconductor substrate. Dielectric material is selectively deposited on the dielectric layer relative to the metal layer of the semiconductor substrate. The graphene is a high-quality graphene film that serves as an inhibitor during deposition of the dielectric material. In some implementations, the dielectric material may be a metal oxide. In some implementations, the dielectric material may be a low-k dielectric material. The graphene remains throughout semiconductor integration processes. In some implementations, the graphene may be subsequently
(Continued)

modified by to permit deposition on the surface of the graphene or the graphene may be subsequently removed.

13 Claims, 12 Drawing Sheets

(51) Int. Cl.

| | |
|---|---|
| ***C23C 16/40*** | (2006.01) |
| ***C23C 16/50*** | (2006.01) |
| ***C23C 16/56*** | (2006.01) |
| ***H01J 37/32*** | (2006.01) |
| ***H01L 23/522*** | (2006.01) |
| ***H01L 23/532*** | (2006.01) |
| ***H10W 20/00*** | (2026.01) |
| ***H10W 20/41*** | (2026.01) |
| ***H10W 20/42*** | (2026.01) |
| ***H10W 20/44*** | (2026.01) |
| ***H10W 20/47*** | (2026.01) |

(52) U.S. Cl.
CPC .......... *C23C 16/405* (2013.01); *C23C 16/407* (2013.01); *C23C 16/50* (2013.01); *C23C 16/56* (2013.01); *H01J 37/32357* (2013.01); *H10W 20/038* (2026.01); *H10W 20/0523* (2026.01); *H10W 20/077* (2026.01); *H10W 20/425* (2026.01); *H10W 20/4462* (2026.01); *H01J 2237/332* (2013.01); *H10W 20/42* (2026.01); *H10W 20/47* (2026.01)

(58) Field of Classification Search
CPC ......... H01L 23/53266; H01L 23/53276; H01L 23/5226; H01L 23/53295; H01L 21/28562; H01L 21/76829; H01L 21/76849; H01L 21/76856; H01L 21/76897; H01L 21/02527; H01L 21/0262; H01L 21/02126; H01L 21/02167; H01L 21/0217; H01L 21/02178; H01L 21/02274; H01L 21/02554; H01L 21/02565; H01L 21/02642; H01L 21/306; H01L 21/0228; H01L 21/32; H01L 21/321; C23C 16/26; C23C 16/403; C23C 16/405; C23C 16/407; C23C 16/50; C23C 16/56; C23C 16/452; C23C 16/45563; C23C 16/04; H01J 37/32357; H01J 2237/332; H10W 20/075; H10W 20/038; H10W 20/0523; H10W 20/077; H10W 20/425; H10W 20/4462; H10W 20/42; H10W 20/47; H10W 20/037; H10W 20/048; H10W 20/069; H10W 20/0693; H10W 20/074; H10P 14/24; H10P 14/272; H10P 14/3426; H10P 14/3434; H10P 14/432; H10P 14/61; H10P 14/3406; H10P 14/6336; H10P 14/6339; H10P 50/00; H10P 95/00; H10P 14/6905; H10P 14/6922; H10P 14/69391; H10P 14/69433
See application file for complete search history.

(56) References Cited

U.S. PATENT DOCUMENTS

| | | | | |
|---|---|---|---|---|
| 6,451,705 | B1 | 9/2002 | Trapp et al. | |
| 8,084,339 | B2 | 12/2011 | Antonelli et al. | |
| 8,623,761 | B2 | 1/2014 | Bonilla et al. | |
| 9,184,060 | B1 | 11/2015 | Lee | |
| 9,209,136 | B2 | 12/2015 | Barth | |
| 9,337,149 | B2 | 5/2016 | Im et al. | |
| 9,508,801 | B2 | 11/2016 | Franklin et al. | |
| 9,514,932 | B2 | 12/2016 | Mallick et al. | |
| 9,837,270 | B1 | 12/2017 | Varadarajan et al. | |
| 9,865,699 | B2 | 1/2018 | Kondo et al. | |
| 10,453,681 | B2 | 10/2019 | Tapily et al. | |
| 10,465,291 | B2 | 11/2019 | Yeh et al. | |
| 11,075,113 | B2 | 7/2021 | Lee et al. | |
| 11,205,618 | B2 | 12/2021 | Yang et al. | |
| 11,626,282 | B2 | 4/2023 | Lee et al. | |
| 11,682,622 | B2 | 6/2023 | Byun et al. | |
| 11,887,850 | B2 | 1/2024 | Shin et al. | |
| 12,354,880 | B2 | 7/2025 | Belau et al. | |
| 12,368,075 | B2 | 7/2025 | Varadarajan et al. | |
| 2003/0096504 | A1 | 5/2003 | Ryu et al. | |
| 2006/0264060 | A1 | 11/2006 | Ramaswamy et al. | |
| 2006/0292846 | A1 | 12/2006 | Pinto et al. | |
| 2007/0032054 | A1 | 2/2007 | Ramaswamy et al. | |
| 2007/0032082 | A1 | 2/2007 | Ramaswamy et al. | |
| 2008/0188081 | A1 | 8/2008 | Chi et al. | |
| 2008/0265301 | A1 | 10/2008 | Fang et al. | |
| 2008/0296736 | A1 | 12/2008 | Fu et al. | |
| 2012/0080661 | A1 | 4/2012 | Saito et al. | |
| 2012/0080796 | A1 | 4/2012 | Wada et al. | |
| 2012/0139114 | A1 | 6/2012 | Zhang et al. | |
| 2012/0276743 | A1 | 11/2012 | Won et al. | |
| 2013/0059450 | A1 | 3/2013 | Le Gouil et al. | |
| 2013/0089988 | A1 | 4/2013 | Wang et al. | |
| 2013/0113102 | A1 | 5/2013 | Bao et al. | |
| 2013/0302940 | A1 | 11/2013 | Avouris et al. | |
| 2014/0045342 | A1 | 2/2014 | Mallick et al. | |
| 2014/0127896 | A1 | 5/2014 | Bonilla et al. | |
| 2014/0284802 | A1 | 9/2014 | Sakata et al. | |
| 2014/0356549 | A1 | 12/2014 | Varadarajan | |
| 2014/0367857 | A1 | 12/2014 | Yang et al. | |
| 2015/0041981 | A1 | 2/2015 | Bao et al. | |
| 2015/0079342 | A1 | 3/2015 | Boyd et al. | |
| 2015/0093915 | A1 | 4/2015 | Reddy et al. | |
| 2015/0132968 | A1 | 5/2015 | Ren et al. | |
| 2015/0232343 | A1* | 8/2015 | Liu et al. | C23C 16/0227 428/216 |
| 2015/0303056 | A1 | 10/2015 | Varadarajan et al. | |
| 2015/0332932 | A1 | 11/2015 | Hirotsu et al. | |
| 2015/0371851 | A1 | 12/2015 | Lee et al. | |
| 2016/0005648 | A1 | 1/2016 | Yang et al. | |
| 2016/0017484 | A1 | 1/2016 | Kikuchi et al. | |
| 2016/0035676 | A1 | 2/2016 | Im et al. | |
| 2016/0056384 | A1 | 2/2016 | Barth | |
| 2016/0075560 | A1 | 3/2016 | Kagaya et al. | |
| 2016/0087028 | A1 | 3/2016 | Hirota et al. | |
| 2016/0204204 | A1 | 7/2016 | Franklin et al. | |
| 2016/0270237 | A1 | 9/2016 | Cho et al. | |
| 2017/0029942 | A1 | 2/2017 | Matsumoto | |
| 2017/0051399 | A1 | 2/2017 | Veerasamy | |
| 2017/0076955 | A1* | 3/2017 | Hudson et al. | H01J 37/32009 |
| 2017/0148640 | A1 | 5/2017 | Wang et al. | |
| 2017/0178899 | A1 | 6/2017 | Kabansky et al. | |
| 2017/0301537 | A1 | 10/2017 | Behera et al. | |
| 2017/0372899 | A1 | 12/2017 | Yang et al. | |
| 2018/0033727 | A1 | 2/2018 | Lee et al. | |
| 2018/0148832 | A1 | 5/2018 | Chatterjee et al. | |
| 2018/0182612 | A1 | 6/2018 | Fukuoka et al. | |
| 2018/0182664 | A1 | 6/2018 | McHugh et al. | |
| 2018/0301335 | A1 | 10/2018 | Tapily et al. | |
| 2018/0350913 | A1 | 12/2018 | Yang et al. | |
| 2019/0010604 | A1 | 1/2019 | Boyd et al. | |
| 2019/0057862 | A1 | 2/2019 | Yang et al. | |
| 2019/0074164 | A1 | 3/2019 | Li | |
| 2019/0085457 | A1 | 3/2019 | Ifuku et al. | |
| 2019/0093227 | A1 | 3/2019 | Yeh et al. | |
| 2019/0144283 | A1 | 5/2019 | Jakobsen et al. | |
| 2019/0157076 | A1 | 5/2019 | Hausmann et al. | |
| 2019/0161351 | A1 | 5/2019 | Song et al. | |
| 2019/0233942 | A1 | 8/2019 | Haberle et al. | |
| 2019/0288132 | A1 | 9/2019 | Wang et al. | |
| 2019/0345609 | A1 | 11/2019 | Chen et al. | |
| 2019/0363048 | A1 | 11/2019 | Zhao et al. | |
| 2019/0393030 | A1 | 12/2019 | Jiang et al. | |
| 2020/0048762 | A1 | 2/2020 | Ke et al. | |
| 2020/0118924 | A1 | 4/2020 | Yang et al. | |

(56) References Cited

U.S. PATENT DOCUMENTS

| | | | |
|---|---|---|---|
| 2020/0216949 A1 | 7/2020 | Bhuyan et al. |
| 2021/0020444 A1 | 1/2021 | Tapily |
| 2021/0028149 A1 | 1/2021 | Makala et al. |
| 2021/0082832 A1 | 3/2021 | Yang et al. |
| 2021/0125929 A1 | 4/2021 | Shin et al. |
| 2021/0151348 A1 | 5/2021 | Utsuno et al. |
| 2021/0210346 A1 | 7/2021 | Shin et al. |
| 2022/0130572 A1 | 4/2022 | Deemer et al. |
| 2022/0139823 A1 | 5/2022 | Lin et al. |
| 2022/0157711 A1 | 5/2022 | Lee et al. |
| 2022/0375722 A1 | 11/2022 | Varadarajan et al. |
| 2022/0399230 A1 | 12/2022 | Varadarajan et al. |
| 2023/0081817 A1 | 3/2023 | Belau et al. |
| 2024/0030062 A1 | 1/2024 | Hausmann et al. |
| 2024/0213159 A1 | 6/2024 | Parbatani et al. |
| 2024/0282570 A1 | 8/2024 | Varadarajan et al. |
| 2024/0332128 A1 | 10/2024 | Uzoh et al. |
| 2024/0356062 A1 | 10/2024 | Hersam et al. |
| 2024/0395544 A1 | 11/2024 | Sharma et al. |
| 2025/0096036 A1 | 3/2025 | Parbatani et al. |

FOREIGN PATENT DOCUMENTS

| | | | |
|---|---|---|---|
| CN | 103981507 | A | 8/2014 |
| CN | 104141113 | A | 11/2014 |
| CN | 105702630 | A | 6/2016 |
| CN | 107833825 | A | 3/2018 |
| CN | 115428141 | A | 12/2022 |
| CN | 117981070 | A | 5/2024 |
| CN | 117999646 | A | 5/2024 |
| DE | 102013113853 | A1 | 6/2015 |
| DE | 102018110189 | A1 | 10/2019 |
| EP | 3510624 | B1 | 2/2021 |
| JP | H04176868 | A | 6/1992 |
| JP | H0594970 | A | 4/1993 |
| JP | H07169747 | A | 7/1995 |
| JP | H1053883 | A | 2/1998 |
| JP | 2000311890 | A | 11/2000 |
| JP | 2011190156 | A | 9/2011 |
| JP | 2013510071 | A | 3/2013 |
| JP | 2015073096 | A | 4/2015 |
| JP | 2015519748 | A | 7/2015 |
| JP | 2015519749 | A | 7/2015 |
| JP | 2015211139 | A | 11/2015 |
| JP | 2016105465 | A | 6/2016 |
| JP | 2017512181 | A | 5/2017 |
| JP | 2018076604 | A | 5/2018 |
| JP | 2018105998 | A | 7/2018 |
| JP | 2018182328 | A | 11/2018 |
| JP | 2020017728 | A | 1/2020 |
| JP | 6648563 | B2 | 2/2020 |
| JP | 2023514831 | A | 4/2023 |
| JP | 2023531617 | A | 7/2023 |
| JP | 2024518276 | A | 5/2024 |
| KR | 20150116570 | A | 10/2015 |
| KR | 20160000863 | A | 1/2016 |
| KR | 101633039 | B1 | 6/2016 |
| KR | 20180075898 | A | 7/2018 |
| KR | 20200011197 | A | 2/2020 |
| KR | 20200112446 | A | 10/2020 |
| KR | 20220143731 | A | 10/2022 |
| KR | 20230028788 | A | 3/2023 |
| KR | 20230167695 | A | 12/2023 |
| TW | 201304059 | A | 1/2013 |
| TW | 201438062 | A | 10/2014 |
| TW | 201500572 | A | 1/2015 |
| TW | 201706455 | A | 2/2017 |
| TW | 201810592 | A | 3/2018 |
| TW | 201819283 | A | 6/2018 |
| TW | 201833364 | A | 9/2018 |
| TW | 201839912 | A | 11/2018 |
| TW | 201919992 | A | 6/2019 |
| TW | 202124273 | A | 7/2021 |
| WO | WO-2013172792 | A1 | 11/2013 |
| WO | WO-2014110446 | A2 | 7/2014 |
| WO | WO-2019212986 | A1 | 11/2019 |
| WO | WO-2019246191 | A1 | 12/2019 |
| WO | WO-2020023378 | A1 | 1/2020 |
| WO | WO-2021067118 | A1 | 4/2021 |
| WO | WO-2021168134 | A1 | 8/2021 |
| WO | WO-2021262527 | A1 | 12/2021 |
| WO | WO-2022221881 | A1 | 10/2022 |
| WO | WO-2022271525 | A1 | 12/2022 |
| WO | WO-2023004328 | A1 | 1/2023 |
| WO | WO-2023004329 | A1 | 1/2023 |
| WO | WO-2023023009 | A1 | 2/2023 |
| WO | WO-2024102081 | A1 | 5/2024 |

OTHER PUBLICATIONS

International Preliminary Report on Patentability dated Jan. 5, 2023, in PCT Application PCT/US2021/037885.

International Preliminary Report on Patentability dated Sep. 1, 2022, in PCT Application No. PCT/US2021/018606.

International Search Report and Written Opinion dated Jun. 9, 2021 issued in Application No. PCT/US2021/018606.

International Search Report and Written Opinion dated Nov. 11, 2022 in PCT Application No. PCT/US2022/073906.

International Preliminary Report on Patentability and Written Opinion dated Aug. 25, 2022 in Application No. PCT/US2021/015650.

International Preliminary Report on Patentability dated Apr. 14, 2022 from PCT/US2020/052549.

International Search Report and Written Opinion dated Aug. 5, 2022, in Application No. PCT/US2022/071758.

International Search Report and Written Opinion dated Jan. 13, 2021, in PCT Application No. PCT/US2020/052549.

International Search Report and Written Opinion dated Jul. 8, 2021 in PCT Application No. PCT/US2021/015650.

International Search Report and Written Opinion dated Nov. 16, 2022 in PCT Application No. PCT/US2022/073905.

International Search Report and Written Opinion dated Oct. 7, 2021, in PCT Application No. PCT/US2021/037885.

International Search Report and Written Opinion dated Oct. 13, 2022, in PCT Application No. PCT/US2022/033777.

Nogami, T. et al., "Electromigration and Line R of Graphene Capped Cu Dual Damascene Interconnect", 2021 IEEE International Electron Devices Meeting (IEDM). IEEE, 2021, 4 pages.

U.S. Appl. No. 17/904,046 , inventors Belau et al., filed Aug. 11, 2022.

CN Office Action dated May 11, 2024 in CN Application No. 202080068732.8 with English translation.

Hiramatsu, M., et al., "Initial Growth Process of Carbon Nanowalls Synthesized by Radical Injection Plasma-enhanced Chemical Vapor Deposition," Journal of Applied Physics, 2009, vol. 106, 094302, pp. 1-7.

Hiramatsu, M., et al., "Fabrication of Carbon Nanowalls using Novel Plasma Processing," Japanese Journal of Applied Physics, 2006, vol. 45(6B), pp. 5522-5527.

Hori, M., et al., "Radical-controlled Plasma Processing for Nanofabrication," Journal of Physics D: Applied Physics, 2011, vol. 44, 174027, pp. 1-17.

International Preliminary Report on Patentability and Written Opinion dated Apr. 11, 2024 in PCT Application No. PCT/US2022/077307.

International Preliminary Report on Patentability and Written Opinion dated Feb. 1, 2024 in PCT Application No. PCT/US2022/073905.

International Preliminary Report on Patentability and Written Opinion dated Feb. 1, 2024 in PCT Application No. PCT/US2022/073906.

International Preliminary Report on Patentability and Written Opinion dated Jan. 4, 2024 in PCT Application No. PCT/US2022/033777.

International Preliminary Report on Patentability dated Oct. 26, 2023, in Application No. PCT/US2022/071758.

International Search Report and Written Opinion dated Jan. 20, 2023 in PCT Application No. PCT/US2022/077307.

(56) References Cited

OTHER PUBLICATIONS

JP Office Action dated Nov. 5, 2024 in JP Application No. 2022-519665 with English translation.
JP Office Action dated Oct. 8, 2024 in JP Application No. 2022-549012 with English translation.
TW Office Action dated May 23, 2024 in TW Application No. 109133813 with English translation.
TW Office Action dated May 31, 2024 in TW Application No. 110105693 with English translation.
TW Office Action dated Oct. 30, 2024 in TW Application No. 109133813 with English translation.
U.S. Advisory Action dated Jun. 27, 2024 in U.S. Appl. No. 17/753,776.
U.S. Final Office Action dated Apr. 19, 2024 in U.S. Appl. No. 17/753,776.
U.S. Non-Final Office Action dated Dec. 22, 2023 in U.S. Appl. No. 17/753,776.
U.S. Non-Final Office Action dated Oct. 10, 2024 in U.S. Appl. No. 17/904,046.
U.S. Appl. No. 18/291,532, inventor Parbatani A, filed Jan. 23, 2024.
U.S. Restriction requirement dated Jun. 22, 2023, in U.S. Appl. No. 17/753,776.
Zhang, Y., et al., "Low Temperature Remote Plasma Enhanced Atomic Layer Deposition of Graphene and Characterization of Its Atomic Level Structure," Journal of Materials Chemistry c 2014, vol. 2, pp. 7570-7574.
CN Office Action dated Jan. 9, 2025 in CN Application No. 202080068732.8 with English translation.
CN Office Action dated Mar. 22, 2025 in CN Application No. 202080068732.8, with English Translation.
JP Office Action dated Jul. 8, 2025 in JP Application No. 2022-519665, with English Translation.
JP Office Action dated Jun. 17, 2025 in JP Application No. 2022-577465, with English Translation.
KR Decision for Grant and Search Report dated Jul. 23, 2025 in KR Application No. 10-2022-7032313, with English translation.
KR Office Action dated Apr. 8, 2025 in KR Application No. 10-2022-7031230, with English Translation.
KR Office Action dated Jul. 17, 2025 in KR Application No. 10-2022-7014699, with English Translation.
KR Office Action dated Jun. 13, 2025 in KR Application No. 10-2023-7002700, with English Translation.
KR Office Action dated May 8, 2025 in KR Application No. 10-2022-7032313, with English Translation.
SG Search Report and Written Opinion dated Jul. 14, 2025 in SG Application No. 11202252324M.
SG Search Report and Written Opinion dated Jul. 18, 2025 in SG Application No. 11202261351U.
SG Written Opinion dated Jan. 9, 2025 in SG Application No. 11202202928P.
TW Office Action dated Jan. 7, 2025 in TW Application No. 110122691 with English translation.
TW Office Action dated Jul. 29, 2025 in TW Application No. 114107015, with English Translation.
U.S. Corrected Notice of Allowance dated Jun. 17, 2025 in U.S. Appl. No. 17/904,046.
U.S. Corrected Notice of Allowance dated Jun. 24, 2025 in U.S. Appl. No. 17/904,361.
U.S. Corrected Notice of Allowance dated Mar. 28, 2025 in U.S. Appl. No. 17/904,361.
U.S. Final Office Action dated Jul. 29, 2025 in U.S. Appl. No. 17/753,776.
US Non-Final Office Action dated Apr. 24, 2025 in U.S. Appl. No. 17/753,776.
U.S. Notice of Allowance dated Mar. 12, 2025 in U.S. Appl. No. 17/904,046.
U.S. Notice of Allowance dated Mar. 19, 2025 in U.S. Appl. No. 17/904,361.
CN Office Action dated Dec. 3, 2025 in CN Application No. 202080068732.8, with English Translation.
JP Office Action dated Dec. 16, 2025 in JP Application No. 2023-562820, with English Translation.
KR Office Action dated Aug. 21, 2025 in KR Application No. 10-2022-7045903, with English Translation.
U.S. Non-Final Office Action dated Nov. 10, 2025 in U.S. Appl. No. 17/753,776.
U.S. Notice of Allowance dated Dec. 31, 2025 in U.S. Appl. No. 18/555,507.
KR Decision to Grant and Search Report dated Jan. 24, 2026 in KR Application No. 10-2022-7031230, with English translation.
KR Office Action dated Feb. 6, 2026 in KR Application No. 10-2024-7006109, with English Translation.
KR Office Action dated Feb. 6, 2026 in KR Application No. 10-2024-7006110, with English Translation.
KR Office Action dated Jan. 26, 2026 in KR Application No. 10-2023-7002700, with English Translation.
KR Office Action dated Mar. 9, 2026 in KR Application No. 10-2023-7002700, with English Translation.
Singh S V., et al., "A Hard Graphite like Hydrogenated Amorphous Carbon Grown at High Deposition Rate," Applied Physics Letter, Jun. 2008, vol. 92, pp. 1-4.
Singh S V., et al., "Hard Graphitelike Hydrogenated Amorphous Carbon Grown at High Rates by a Remote Plasma," Journal of Applied Physics, Jan. 2010, vol. 107, pp. 1-11.
TW Notice of Allowance and Search Report dated Jan. 28, 2026 in TW Application No. 111114441, with English translation.
TW Office Action and Search Report dated Feb. 5, 2026 in TW Application No. 111122791, with English Translation.
TW Office Action and Search Report dated Jan. 8, 2026 in TW Application No. 111127321, with English Translation.
TW Office Action dated Feb. 26, 2026 in TW Application No. 111136482, with English Translation.
U.S. Final Office Action dated Mar. 10, 2026 in U.S. Appl. No. 17/753,776.
U.S. Non-Final Office Action dated Feb. 9, 2026 in U.S. Appl. No. 18/569,100.
U.S. Non-Final Office Action dated Mar. 19, 2026 in U.S. Appl. No. 18/291,200.
U.S. Non-Final Office Action dated Mar. 20, 2026 in U.S. Appl. No. 18/291,532.
JP Office Action dated Apr. 21, 2026 in JP Application No. 2025-24918, with English Translation.
KR Office Action dated Apr. 15, 2026 in KR Application No. 10-2022-7014699, with English Translation.
TW Office Action and Search Report dated Apr. 24, 2026 in TW Application No. 111127318, with English Translation.
U.S. Final Office Action dated May 21, 2026 in U.S. Appl. No. 18/569,100.
U.S. Non-Final Office Action dated Apr. 28, 2026 in U.S. Appl. No. 18/694,600.
CN Office Action dated Jun. 30, 2026 in CN Application No. 202080068732.8, with English Translation.

* cited by examiner

SELECTIVE DEPOSITION USING GRAPHENE AS AN INHIBITOR

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Graphene is an allotrope of carbon in which the atoms are arrayed in a single atom sheet in a regular hexagonal pattern. Graphene has attracted interest in many fields and industries because of its high electrical conductivity, high thermal conductivity, good mechanical strength and toughness, optical transparency, and high electron mobility, among other favorable properties. Interest is growing in graphene in the semiconductor industry.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of selective deposition on a dielectric layer. The method comprises providing a semiconductor substrate, where the semiconductor substrate comprises a metal layer formed in a dielectric layer, the metal layer having an exposed metal surface. The method further comprises selectively depositing graphene on the exposed metal surface and selectively depositing a dielectric material on the dielectric layer.

In some implementations, a surface of the graphene is free or substantially free of hydrogen-terminated sites and hydroxyl-terminated sites. In some implementations, the graphene inhibits deposition of the dielectric material on the graphene when the dielectric material is selectively deposited on the dielectric layer. In some implementations, the dielectric material comprises a metal oxide. In some implementations, the metal oxide comprises aluminum oxide, hafnium oxide, zirconium oxide, yttrium oxide, zinc oxide, titanium oxide, or combinations thereof. In some implementations, a thickness of the metal oxide is between about 5 Å and about 60 Å. In some implementations, the dielectric material comprises a low-k dielectric material. In some implementations, the method further comprises depositing a metal oxide on the low-k dielectric material and the graphene, where the metal oxide has a different etch selectivity than the low-k dielectric material and a thickness of the low-k dielectric material is at least two times greater than a thickness of the metal oxide. In some implementations, the metal layer comprises copper, cobalt, ruthenium, nickel, molybdenum, or combinations thereof. In some implementations, exposing the graphene to a non-direct plasma to modify a surface of the graphene, and depositing a metal oxide on the modified surface of the graphene and the dielectric material by a thermal-based deposition technique. In some implementations, depositing the metal oxide comprises depositing aluminum oxide by atomic layer deposition (ALD). In some implementations, the method further comprises removing the graphene, and depositing a metal oxide on the exposed metal surface and the dielectric material. In some implementations, the method further comprises exposing the graphene to a non-direct plasma to modify a surface of the graphene, and depositing a hermetic barrier on the modified surface of the graphene and the dielectric material by a non-direct plasma deposition technique. In some implementations, depositing the hermetic barrier comprises depositing a nitrogen-doped silicon carbide, oxygen-doped silicon carbide, or silicon nitride using remote hydrogen plasma chemical vapor deposition (CVD). In some implementations, the non-direct plasma comprises radicals of hydrogen mixed with radicals of oxygen, ammonia, nitrogen, or combinations thereof. In some implementations, the method further comprises removing the graphene, and depositing a hermetic barrier on the exposed metal surface and the dielectric material. In some implementations, selectively depositing the graphene on the exposed metal surface comprises flowing one or more hydrocarbon precursors into a reaction chamber and towards the semiconductor substrate, generating, from a hydrogen source gas, radicals of hydrogen in a remote plasma source, and introducing the radicals of hydrogen into the reaction chamber and towards the semiconductor substrate, wherein the radicals of hydrogen react with the one or more hydrocarbon precursors to deposit the graphene on the exposed metal surface.

Also provided herein is a substrate processing apparatus. The apparatus comprises a reaction chamber, a substrate support in the reaction chamber and configured to support a substrate, where the substrate comprises a metal layer formed in a dielectric layer, the metal layer having an exposed metal surface, a remote plasma source upstream of the reaction chamber, where the exposed metal surface faces towards the remote plasma source, one or more gas outlets in the reaction chamber and downstream from the remote plasma source, and a controller. The controller is configured to perform the following operations: selectively deposit graphene on the exposed metal surface of the substrate, and selectively deposit a dielectric material on the dielectric layer of the substrate.

Also provided herein is a semiconductor device. The semiconductor device comprises a first dielectric layer, a first metal layer formed in the first dielectric layer, a selective graphene film selectively formed on a top surface of the first metal layer relative to the first dielectric layer, and a selective dielectric layer selectively formed on a top surface of the first dielectric layer relative to the first metal layer.

In some implementations, the selective dielectric layer comprises a metal oxide, wherein the first dielectric layer comprises a low-k dielectric material, and wherein the first metal layer comprises copper, cobalt, ruthenium, nickel, molybdenum, or combinations thereof. In some implementations, the semiconductor device further comprises an etch stop layer over the selective dielectric layer and the selective graphene film, wherein the etch stop layer comprises a metal oxide. In some implementations, the semiconductor device further comprises a second dielectric layer over the etch stop layer, a second metal layer formed in the second dielectric layer, and a via formed in the second dielectric layer, where the via is between the selective graphene film and the second metal layer, the via providing electrical interconnection between the first metal layer and the second metal layer. In some implementations, an etch selectivity of the etch stop layer is different than the second dielectric layer, and where an etch selectivity of the selective dielectric layer is different than the etch stop layer.

DETAILED DESCRIPTION

Figure 1:
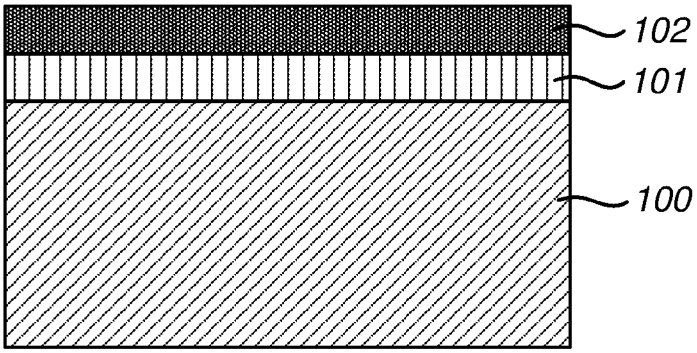
FIG. 1 illustrates a cross-sectional schematic of an example substrate having a metal surface with graphene deposited thereon according to some implementations.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Deposition of Graphene

There is a growing interest in synthesizing large-area graphene films in semiconductor applications. However, there are many challenges associated with production of graphene in sufficient quantities and under suitable conditions for semiconductor integration. Many production methods suffer from low surface coverage because of the difficulty of growing graphene with minimal defects. Thus, scalability to produce large-area graphene films represents a particular problem, especially large-area graphene films on semiconductor wafers. Furthermore, graphene films are typically grown by thermal chemical vapor deposition (CVD). Thermal CVD methods are generally favored for synthesis of large-area, high-quality graphene. However, thermal CVD of graphene is often performed at elevated temperatures, which may not necessarily be compatible with semiconductor applications. Under such high temperatures, various materials such as semiconductors and metals on semiconductor wafers may be physically damaged.

Thermal CVD is a common method of depositing graphene. The thermal CVD process involves at least two steps: activation of gaseous precursors and chemical reaction to form a stable, solid film on a suitable substrate. In thermal CVD, activation of gaseous precursors can occur by thermal decomposition. At elevated temperatures, hydrocarbon precursors thermally decompose and adsorb onto a substrate surface. Hydrocarbon radicals are chemically reactive and may interact with the substrate surface. The substrate surface may be a metal surface that acts as a catalyst for nucleation and growth of graphene. Without being limited by any theory, the catalytic metal surface may dehydrogenate the hydrocarbon radicals so that carbon atoms may bond with other carbon atoms, thereby promoting nucleation and growth of graphene. Various transition metals such as copper have been recognized as catalysts for nucleation and growth of graphene.

Activation of hydrocarbon species and graphene growth can depend on factors such as temperature and the metal surface on which graphene is grown. In addition, graphene growth can depend on carbon solubility on the metal surface. If the metal has high carbon solubility, carbon more easily dissolves in the metal and tends to precipitate on the metal surface. This generally leads to less uniform graphene layers and more microstructural defects owing to multiple nucleation sites and an unpredictable quantity of segregated carbon on the metal surface. Nickel substrates, for example, have high carbon solubility and typically lead to multiple layers of low-quality graphene or disordered carbon. If the metal has low carbon solubility, carbon less easily dissolves in the metal and results in an extensive surface migration of carbon adatoms on the metal surface and minimal diffusion into bulk metal. This generally leads to more uniform graphene layers and fewer microstructural defects owing to more controlled growth. Copper substrates, for example, have low carbon solubility and result in epitaxial growth of high-quality graphene. The high-quality graphene may be grown as a single layer, bilayer, or few-layer graphene film.

Plasma-enhanced chemical vapor deposition (PECVD) is another method of depositing graphene. Whereas thermal CVD methods activate hydrocarbon precursors by thermal decomposition, energized electrons generated by plasma cause ionization, excitation, and dissociation of hydrocarbon precursors in PECVD methods. The plasma may be formed in-situ or remotely. Typically, hydrocarbon precursors (e.g., methane) are activated in a plasma and a substrate is exposed to the plasma. The plasma may be generated using a radio-frequency (RF) plasma source, microwave (MW) plasma source, surface wave (SW) plasma source, or remote plasma source. By way of an example, molecular hydrogen and methane gas may be introduced in a reaction chamber and direct RF plasma may be ignited to promote graphene growth on a substrate. With PECVD, graphene growth in some PECVD methods may be performed at lower temperatures compared to thermal CVD methods. Moreover, graphene growth in some PECVD methods may be accomplished on non-metal substrates such as dielectric materials. In other words, plasma-based methods may deposit graphene in the absence of metal catalysts. Plasma-based methods may deposit graphene at lower temperatures and without the assistance of metal catalysts.

FIG. 1A illustrates a cross-sectional schematic of an example substrate having a metal surface with graphene deposited thereon according to some implementations. The substrate 100 can be any wafer, semiconductor wafer, partially fabricated integrated circuit, printed circuit board, display screen, or other appropriate workpiece. In some implementations, the substrate 100 is a semiconductor substrate such as a silicon (Si) substrate. The substrate 100 can include a metal surface 101. As discussed below, the metal surface 101 can also be referred to as a temperature sensitive underlayer. In some implementations, the metal surface 101 can include any appropriate metal such as a transition metal. For example, the metal surface 101 can include copper (Cu), ruthenium (Ru), nickel (Ni), molybdenum (Mo), cobalt (Co), or combinations thereof. A graphene film 102 can be deposited on the metal surface 101.

In some implementations, depositing the graphene film 102 on the metal surface 101 of the substrate 100 may be accomplished by remote hydrogen plasma CVD. In some other implementations, depositing the graphene film 102 on the metal surface 101 of the substrate 100 may be accomplished using any suitable deposition technique such as thermal CVD or PECVD. A remote hydrogen plasma CVD method may deposit the graphene film 102 at low temperatures that are compatible with semiconductor processing, such as back end of line (BEOL) semiconductor processing. In some implementations, the graphene film 102 may be deposited at temperatures below about 500° C., below about 450° C., below about 400° C., below about 350° C., below about 300° C., or between about 200° C. and about 400° C.

When depositing the graphene film 102 using remote hydrogen plasma CVD, a hydrocarbon precursor is flowed to the metal surface 101 of the substrate 100 and hydrogen radicals are generated in a remote plasma source upstream of the hydrocarbon precursor flow. The hydrogen radicals interact with the hydrocarbon precursor to activate the hydrocarbon precursor downstream from the remote plasma source, and the activated hydrocarbon precursor interacts with the metal surface 101 to cause graphene film 102 to deposit. In some implementations, the hydrocarbon precursor includes an alkene group or alkyne group.

In some implementations of the present disclosure, the substrate 100 can include a temperature sensitive underlayer 101. The temperature sensitive underlayer 101 may have a temperature sensitive limit. Above the temperature sensitive limit of the temperature sensitive underlayer 101, the temperature sensitive underlayer 101 melts or is otherwise physically damaged. The temperature sensitive limit may be between about 400° C. and about 700° C. for many materials of the temperature sensitive underlayer 101. Some thermal CVD methods and some conventional plasma-based CVD methods may exceed the temperature sensitive limit of the temperature sensitive underlayer 101. Examples of temperature sensitive underlayers 101 can include transition metals such as copper, cobalt, and ruthenium. In some implementations, a graphene film 102 is deposited on the temperature sensitive underlayer 101. In some implementations, the graphene film 102 is deposited at sufficiently low temperatures that do not melt or otherwise physically damage the temperature sensitive underlayer 101. The substrate 100 may be a semiconductor wafer or semiconductor workpiece. Hence, the graphene film 102 may be deposited as a large-area graphene film on the substrate 100 at full wafer level.

In some implementations, the graphene film 102 is deposited using remote hydrogen plasma CVD. As used herein, the term "remote" in literature generally refers to the remoteness of the substrate from the plasma. As used herein, a "remote plasma" is a plasma in which plasma generation occurs at a location that is remote from the substrate. Here, the remote hydrogen plasma may contain hydrogen radicals but does not contain carbon radicals. Instead, carbon radicals are generated downstream from a remote plasma source. This means that in the "remote plasma" of some implementations, precursor gas is not introduced into the plasma-generating region. Hydrocarbon precursors are independently flowed into a reaction chamber and are activated by hydrogen radicals generated from the remote plasma source. Moreover, the carbon radicals are generated from hydrocarbon precursors containing alkene or alkyne groups. In fact, hydrocarbon precursors that are alkanes (e.g., methane) do not deposit in implementations involving remote hydrogen plasma CVD. When using the remote hydrogen plasma CVD method, graphene deposition selectively deposits on metal surfaces. Graphene does not deposit on dielectric or other non-metal surfaces. The remote hydrogen plasma CVD method is an example method that can deposit high-quality graphene film at low temperatures suitable for semiconductor applications. For example, a high-quality graphene film can serve as a barrier layer in damascene or dual damascene structures. Further, the high-quality graphene can serve as a capping layer on top of the metal surface, which reduces resistance by reducing surface scattering. However, it will be understood that the high-quality graphene film may be used in a wide number of industrial applications.

One aspect of the disclosure is an apparatus configured to accomplish the graphene deposition methods described herein. A suitable apparatus includes hardware for accomplishing the process operations and a system controller having instructions for controlling process operations in accordance with the present disclosure. In some implementations, the apparatus for performing the aforementioned process operations can include a remote plasma source. A remote plasma source provides mild reaction conditions compared to a direct plasma.

Figure 2:
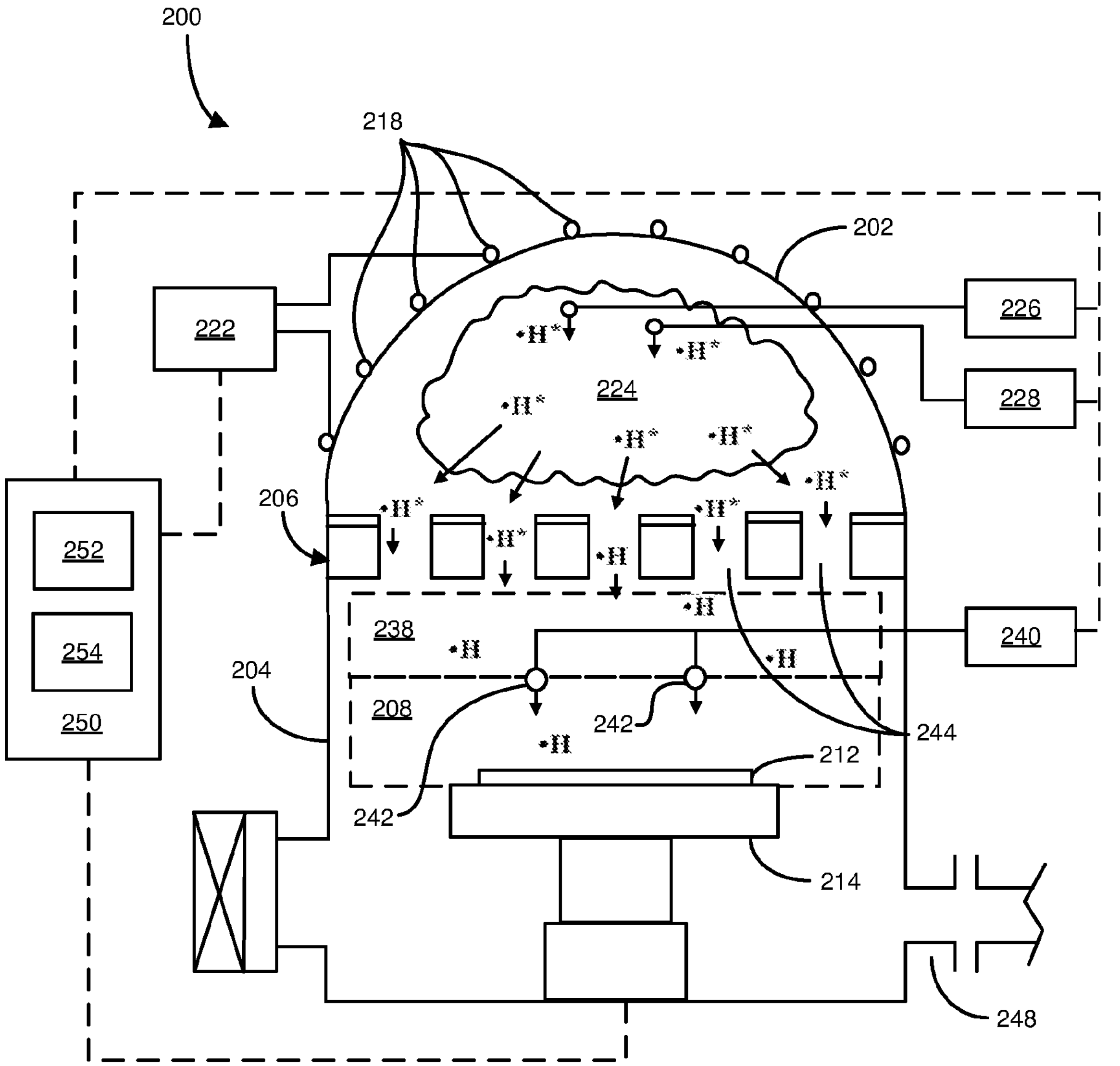
FIG. 2 illustrates a schematic diagram of an example plasma processing apparatus with a remote plasma source according to some implementations.

FIG. 2 illustrates a schematic diagram of an example plasma processing apparatus with a remote plasma source according to some implementations. The plasma processing apparatus 200 includes the remote plasma source 202 separated from a reaction chamber 204. The remote plasma source 202 is fluidly coupled with the reaction chamber 204 via a showerhead 206, which may also be referred to as a multiport gas distributor. Radical species are generated in the remote plasma source 202 and supplied to the reaction chamber 204. One or more hydrocarbon precursors are supplied to the reaction chamber 204 downstream from the remote plasma source 202 and downstream from the showerhead 206. The one or more hydrocarbon precursors react with the radical species in a chemical vapor deposition zone 208 of the reaction chamber 204 to deposit a graphene film on a front surface of a substrate 212. The chemical vapor deposition zone 208 includes an environment adjacent to the front surface of the substrate 212, where the front surface of the substrate 212 faces the remote plasma source 202.

The substrate 212 is supported on a substrate support or pedestal 214. The pedestal 214 may move within the reaction chamber 204 to position the substrate 212 within the chemical vapor deposition zone 208. In the embodiment shown in FIG. 2, pedestal 214 is shown having elevated the substrate 210 within the chemical vapor deposition zone 208. The pedestal 214 may also adjust the temperature of the substrate 212 in some embodiments, which can provide some selective control over thermally activated surface reactions on the substrate 212.

FIG. 2 shows a coil 218 arranged around the remote plasma source 202, where the remote plasma source 202 includes an outer wall (e.g., quartz dome). The coil 218 is electrically coupled to a plasma generator controller 222, which may be used to form and sustain plasma within a plasma region 224 via inductively coupled plasma generation. In some implementations, the plasma generator controller 222 may include a power supply for supplying power to the coil 218, where the power can be in a range between about 1 and 6 kilowatts (kW) during plasma generation. In some implementations, electrodes or antenna for parallel plate or capacitively coupled plasma generation may be used to generate a continuous supply of radicals via plasma excitation rather than inductively coupled plasma generation. Regardless of the mechanism used to ignite and sustain the plasma in the plasma region 224, radical species may continuously be generated using plasma excitation during film deposition. In some implementations, hydrogen radicals are generated under approximately steady-state conditions during steady-state film deposition, though transients may occur at the beginning and end of film deposition.

A supply of hydrogen radicals may be continuously generated within the plasma region 224 while hydrogen gas or other source gas is being supplied to the remote plasma source 202. Excited hydrogen radicals may be generated in the remote plasma source 202. If not re-excited or re-supplied with energy, or re-combined with other radicals, the excited hydrogen radicals lose their energy, or relax. Thus, excited hydrogen radicals may relax to form hydrogen radicals in a substantially low energy state or ground state. The hydrogen radicals in the substantially low energy state or ground state.

The hydrogen gas ($H_2$) or other source gas may be diluted with one or more additional gases. These one or more additional gases may be supplied to the remote plasma source 202. In some implementations, the hydrogen gas or other source gas is mixed with one or more additional gases to form a gas mixture, where the one or more additional gases can include a carrier gas. Non-limiting examples of additional gases can include helium (He), neon (Ne), argon (Ar), krypton (Kr), xenon (Xe), and nitrogen ($N_2$). The one or more additional gases may support or stabilize steady-state plasma conditions within the remote plasma source 202 or aid in transient plasma ignition or extinction processes. In some implementations, diluting hydrogen gas or other source gas with helium, for example, may permit higher total pressures without concomitant plasma breakdown. Put another way, a dilute gas mixture of hydrogen gas and helium may permit higher total gas pressure without increasing plasma power to the remote plasma source 202. In certain embodiments, hydrogen gas is provided in a carrier such helium. As an example, hydrogen gas may be provided in a helium carrier at a concentration of about 1-25% hydrogen or about 1-10% hydrogen.

As shown in FIG. 2, a source gas supply 226 is fluidly coupled with the remote plasma source 202 for supplying the hydrogen gas or source gas. In addition, an additional gas supply 228 is fluidly coupled with the remote plasma source 202 for supplying the one or more additional gases. The one or more additional gases may also include a co-reactant gas. While the embodiment in FIG. 2 depicts the gas mixture of the source gas and the one or more additional gases being introduced through separate gas outlets, it will be understood that the gas mixture may be introduced directly into the remote plasma source 202. That is, a pre-mixed dilute gas mixture may be supplied to the remote plasma source 202 through a single gas outlet.

Gases, such as excited hydrogen and helium radicals and relaxed gases/radicals, flow out of the remote plasma source 202 and into the reaction chamber 204 via the showerhead 206. Gases within the showerhead 206 and within the reaction chamber 204 are generally not subject to continued plasma excitation therein. In some implementations, the showerhead 206 includes an ion filter and/or a photon filter. Filtering ions and/or photons may reduce substrate damage, undesirable re-excitation of molecules, and/or selective breakdown or decomposition of hydrocarbon precursors within the reaction chamber 204. Showerhead 206 may have a plurality of gas ports 234 to diffuse the flow of gases into the reaction chamber 204. In some implementations, the plurality of gas ports 234 may be mutually spaced apart. In some implementations, the plurality of gas ports 234 may be arranged as an array of regularly spaced apart channels or through-holes extending through a plate separating the remote plasma source 202 and the reaction chamber 204. The plurality of gas ports 234 may smoothly disperse and diffuse exiting radicals from the remote plasma source 202 into the reaction chamber 204.

Typical remote plasma sources are far removed from reaction vessels. Consequently, radical extinction and recombination, e.g., via wall collision events, may reduce active species substantially. In contrast, in some implementations, dimensions for the plurality of gas ports 234 may be configured in view of the mean free path or gas flow residence time under typical processing conditions to aid the free passage of radicals into the reaction chamber 204. In some implementations, openings for the plurality of gas ports 234 may occupy between about 5% and about 20% of an exposed surface area of the showerhead 206. In some implementations, the plurality of gas ports 234 may each have an axial length to diameter ratio of between about 3:1 and 10:1 or between about 6:1 and about 8:1. Such aspect ratios may reduce wall-collision frequency for radical species passing through the plurality of gas ports 234 while providing sufficient time for a majority of excited state radical species to relax to ground state radical species. In some implementations, dimensions of the plurality of gas ports 234 may be configured so that the residence time of gases passing through the showerhead 206 is greater than the typical energetic relaxation time of an excited state radical species. Excited state radical species for hydrogen source gas may be denoted by ·H* in FIG. 2 and ground state radical species for hydrogen source gas may be denoted by ·H in FIG. 2.

In some implementations, excited state radical species exiting the plurality of gas ports 234 may flow into a relaxation zone 238 contained within an interior of the reaction chamber 204. The relaxation zone 238 is positioned upstream of the chemical vapor deposition zone 208 but downstream of the showerhead 206. Substantially all or at least 90% of the excited state radical species exiting the showerhead 206 will transition into relaxed state radical species in the relaxation zone 238. Put another way, almost all of the excited state radical species (e.g., excited hydrogen radicals) entering the relaxation zone 238 become de-excited or transition into a relaxed state radical species (e.g., ground state hydrogen radicals) before exiting the relaxation zone 238. In some implementations, process conditions or a geometry of the relaxation zone 238 may be configured so that the residence time of radical species flowing through the relaxation zone 238, e.g., a time determined by mean free path and mean molecular velocity, results in relaxed state radical species flowing out of the relaxation zone 238.

With the delivery of radical species to the relaxation zone 238 from the showerhead 206, one or more hydrocarbon precursors may be introduced into the chemical vapor deposition zone 208. The one or more hydrocarbon precursors may be introduced via a gas distributor or gas outlet 242, where the gas outlet 242 may be fluidly coupled with a precursor supply source 240. The relaxation zone 238 may be contained within a space between the showerhead 206 and the gas outlet 242. The gas outlet 242 may include mutually spaced apart openings so that the flow of the one or more hydrocarbon precursors may be introduced in a direction parallel with gas mixture flowing from the relaxation zone 238. The gas outlet 242 may be located downstream from the showerhead 206 and the relaxation zone 238. The gas outlet 242 may be located upstream from the chemical vapor deposition zone 208 and the substrate 212. The chemical vapor deposition zone 208 is located within the interior of the reaction chamber 204 and between the gas outlet 242 and the substrate 212.

Substantially all of the flow of the one or more hydrocarbon precursors may be prevented from mixing with excited state radical species adjacent to the showerhead 206. Relaxed or ground state radical species mix in a region adjacent to the substrate 212 with the one or more hydrocarbon precursors. The chemical vapor deposition zone 208 includes the region adjacent to the substrate 212 where the relaxed or ground state radical species mix with the one or more hydrocarbon precursors. The relaxed or ground state radical species mix with the one or more hydrocarbon precursors in the gas phase during CVD formation of graphene.

In some implementations, a co-reactant may be introduced from the showerhead 206 and flowed along with the radical species generated in the remote plasma source 202 and into the reaction chamber 204. This may include radicals and/or ions of a co-reactant gas provided in the remote plasma source 202. The co-reactant may be supplied from the additional gas supply 228. In some implementations, the co-reactant may include a nitrogen-containing agent such as nitrogen gas ($N_2$). For example, radicals and/or ions of nitrogen may be generated and flowed with the radical species of hydrogen during pretreatment of a metal surface of the substrate 212.

The gas outlet 242 may be separated from the showerhead 206 by a sufficient distance to prevent back diffusion or back streaming of the one or more hydrocarbon precursors. This can afford sufficient time for radical species of hydrogen to transition from an excited state to a relaxed state (e.g., ground state). In some implementations, the gas outlet 242 may be separated from the plurality of gas ports 234 by a distance between about 0.5 inches and about 5 inches, or between about 1.5 inches and about 4.5 inches, or between about 1.5 inches and about 3 inches.

Process gases may be removed from the reaction chamber 204 via an outlet 248 that is fluidly coupled to a pump (not shown). Thus, excess hydrocarbon precursors, co-reactants, radical species, and diluent and displacement or purge gases may be removed from the reaction chamber 204. In some implementations, a system controller 250 is in operative communication with the plasma processing apparatus 200. In some implementations, the system controller 250 includes a processor system 252 (e.g., microprocessor) configured to execute instructions held in a data system 254 (e.g., memory). In some implementations, the system controller 250 may be in communication with the plasma generator controller 222 to control plasma parameters and/or conditions. In some implementations, the system controller 250 may be in communication with the pedestal 214 to control pedestal elevation and temperature. In some implementations, the system controller 250 may control other processing conditions, such as RF power settings, frequency settings, duty cycles, pulse times, pressure within the reaction chamber 204, pressure within the remote plasma source 202, gas flow rates from the source gas supply 226 and the additional gas supply 228, gas flow rates from the precursor supply source 240 and other sources, temperature of the pedestal 214, and temperature of the reaction chamber 204, among others.

The controller 250 may contain instructions for controlling process conditions for the operation of the plasma processing apparatus 200. The controller 250 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 250 or they may be provided over a network.

In certain embodiments, the controller 250 controls all or most activities of the plasma processing apparatus 200 described herein. For example, the controller 250 may control all or most activities of the plasma processing apparatus 200 associated with depositing graphene and, optionally, other operations in a fabrication flow that includes the graphene. The controller 250 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 250 may be employed in some embodiments. To provide relatively mild reactive conditions at the environment adjacent to the substrate 212, parameters such as the RF power levels, gas flow rates to the plasma region 224, gas flow rates to the chemical vapor deposition zone 208, and timing of the plasma ignition can be adjusted and maintained by controller 250. Additionally, adjusting the substrate position may further reduce the presence of high-energy radical species at the environment adjacent to the substrate 212. In a multi-station reactor, the controller 250 may comprise different or identical instructions for different apparatus stations, thus allowing the apparatus stations to operate either independently or synchronously.

In some embodiments, the controller 250 may include instructions for performing operations such as flowing one or more hydrocarbon precursors through the gas outlet 242 into the reaction chamber 204, providing a source gas into the remote plasma source 202, generating one or more radical species of the source gas in the remote plasma source 202 upstream of the one or more hydrocarbon precursors, introducing the one or more radical species from the remote plasma source 202 into the reaction chamber 204 to react with the one or more hydrocarbon precursors to deposit a graphene on a metal surface of the substrate 212. The one or more radical species in the reaction chamber 204 in an environment adjacent to the substrate 212 may be hydrogen radicals in a ground state. In some implementations, the controller 250 may include instructions for treating the metal surface of the substrate 212 prior to depositing graphene. In some implementations, the controller 250 may include instructions for maintaining a temperature of the substrate 212 equal to or less than about 400° C., or between about 200° C. and about 400° C. In some implementations, each of the one or more hydrocarbon precursors includes an alkene or alkyne group.

In some embodiments, the apparatus 200 may include a user interface associated with controller 250. The user interface may include a display screen, graphical software displays of the apparatus 200 and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

Signals for monitoring the process may be provided by analog and/or digital input connections of the system controller. The signals for controlling the process are output on the analog and digital output connections of the processing system.

In general, the methods described herein can be performed on systems including semiconductor processing equipment such as a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. In general, the electronics are referred to as the controller, which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials (e.g., silicon carbide), surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In addition to graphene deposition described herein, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Raman spectroscopy can be used for the characterization of graphene. Raman spectroscopy can also be suitable for determining the number of graphene layers as well as the amount of disorder in graphene. By identifying certain features of graphene in a Raman spectrum, graphene can be distinguished from disordered or amorphous carbon layers.

Figure 3:
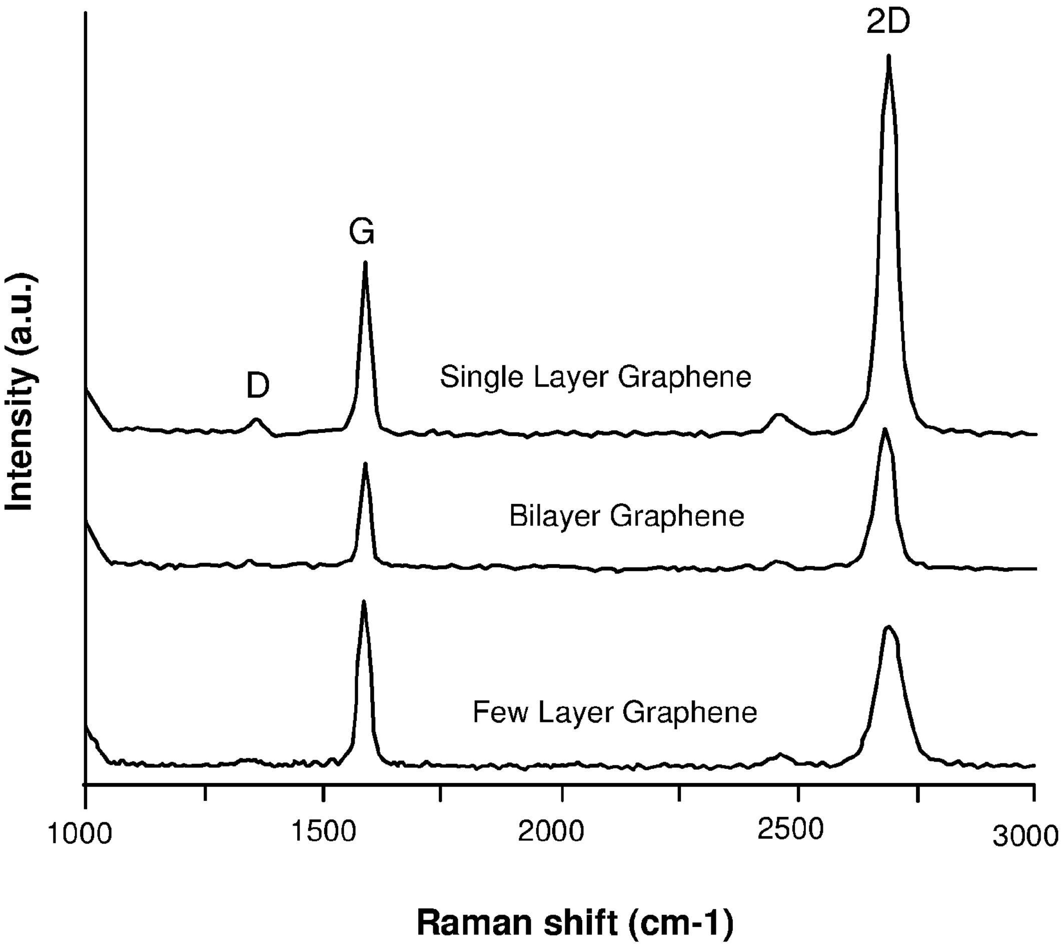
FIG. 3 illustrates a graph showing Raman spectra of examples of single layer graphene and multi-layer graphene according to some implementations.

FIG. 3 illustrates a graph showing Raman spectra of examples of single layer graphene and multi-layer graphene according to some implementations. Graphene can be characterized in a Raman spectrum by the presence of a G peak at around 1580 $cm^{-1}$ and a 2D peak at around 2680 $cm^{-1}$, where the 2D peak is generally equal to or greater in intensity than the G peak. If the 2D peak is significantly less in intensity than the G peak, then the deposited film is not characterized as graphene. The presence of the 2D peak and the G peak are generally strong indicators of the presence of graphene. Disordered carbon or amorphous carbon, however, can be characterized in a Raman spectrum by the presence of a D peak at around 1380 cm'. As disorder increases, the Raman intensity of the D peak usually increases. The higher the D peak, the greater the number of defects in the as-deposited graphene. Such defects may include but are not limited to vacancies that signal a lack of graphene, or grain boundaries of different graphene crystals that otherwise disrupt the planar structure of graphene.

Raman spectroscopy can also be used to determine the number of graphene layers. In some implementations, the ratio of the intensity of the 2D peak to the intensity of the G peak ($I_{2D}/I_G$) can correspond to the number of graphene layers. Specifically, if the ratio of $I_{2D}/I_G$ is greater than 2, then a deposited graphene film corresponds to single layer graphene. If the ratio of $I_{2D}/I_G$ is slightly greater than 1 or slightly less than 1 as shown in FIG. 3, then a deposited graphene film may correspond to bilayer graphene or few layer graphene, respectively.

Raman spectroscopy can also be used to determine the grain size and type of crystal in the graphene structure. In some implementations, the ratio of the intensity of the G peak to the intensity of the D peak ($I_G/I_D$) can correspond to grain size. As the ratio increases, this is an indication of increasing crystal grain size. Additionally, as the ratio decreases, this is an indication of increasing number of defects that may otherwise disrupt the planar structure of graphene.

In some implementations, the graphene film deposited on a metal surface has a thickness equal to or less than about 10 nm, equal to or less than about 5 nm, equal to or less than about 3 nm, or equal to or less than about 1 nm. The thickness of the graphene film can depend on the metal surface on which it is deposited. For example, the graphene film may be a monolayer or a few monolayers thick when deposited on copper, and so the thickness may be less than about 1 nm. The graphene film may be a single layer graphene, bilayer graphene, or few layer graphene. This can occur where the graphene film is deposited on a metal such as copper. In another example, the graphene film may be a few nanometers thick (e.g., about 2-3 nm) when deposited on other metals such as cobalt.

Figure 4:
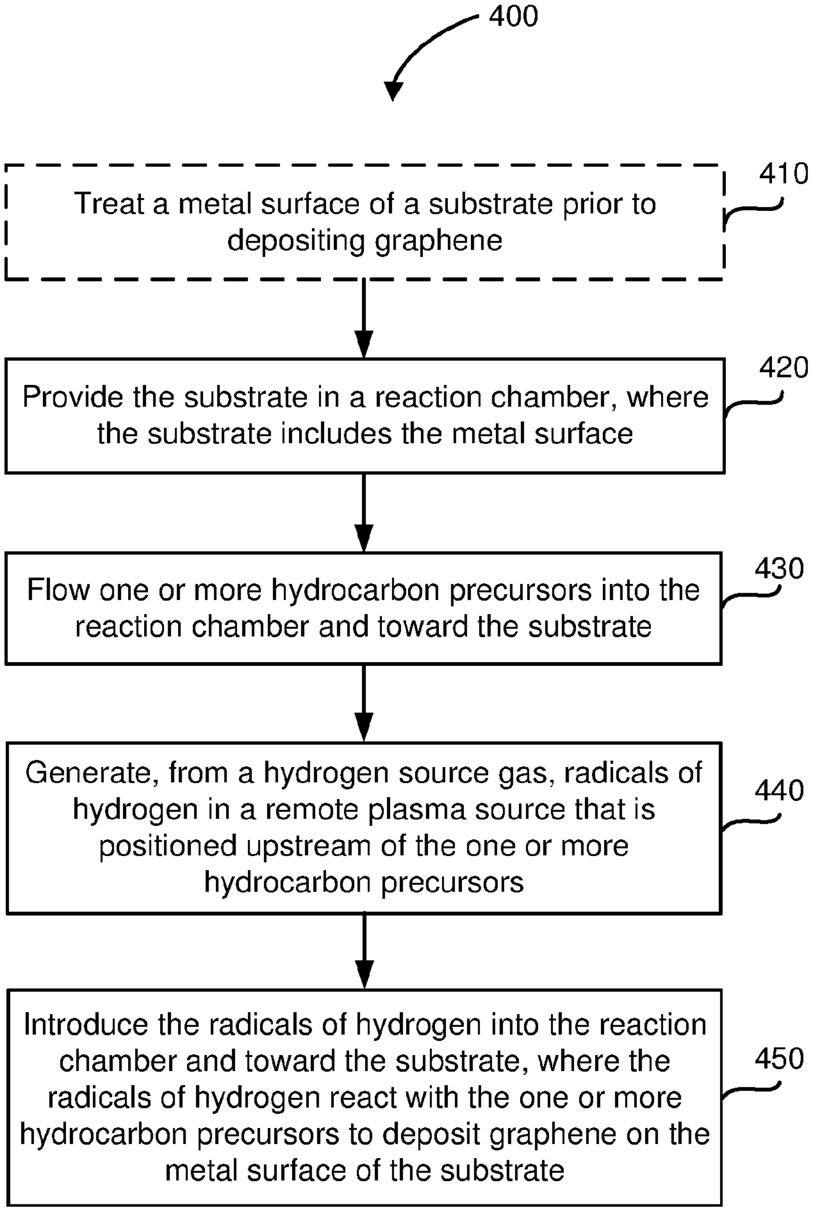
FIG. 4 illustrates a flow diagram of an example method of depositing graphene on a metal surface of a substrate according to some implementations.

FIG. 4 illustrates a flow diagram of an example method of depositing graphene on a metal surface of a substrate according to some implementations. The operations of a process 400 may be performed in different orders and/or with different, fewer, or additional operations. The operations of the process 400 may be performed using a plasma processing apparatus shown in FIG. 2. In some implementations, the operations of the process 400 may be implemented, at least in part, according to software stored in one or more non-transitory computer readable media.

At block 410 of the process 400, a metal surface of a substrate may be optionally treated prior to depositing graphene. Graphene deposition can depend on the smoothness and purity of the metal surface on which graphene is grown. Surface preparation techniques may be applied on the metal surface to polish the substrate and remove impurities. Polishing the substrate may be performed by a light etch in some implementations. Removal of impurities may be performed by a chemical treatment that removes, for example, metal oxides. Removal of impurities may additionally or alternatively involve removal of residues or contaminants from chemical mechanical planarization (CMP) processes. In some implementations, the treatment of the metal surface may occur before any diffusion barrier deposition, etch stop deposition, or hermetic barrier deposition.

In some implementations, treating the metal surface of the substrate can include exposing the metal surface to a plasma of a reducing gas species. Treatment of the metal surface can at least include removal of impurities and/or reduction of metal oxides by exposure to plasma. In some implementations, the plasma can include ions and radicals of a reducing gas species. Reducing gas species can include, for example, hydrogen gas ($H_2$), ammonia ($NH_3$), or combinations thereof. Thus, the metal surface may be treated by an $H_2$ plasma, $NH_3$ plasma, or $H_2/NH_3$ plasma. The plasma may be a direct (in-situ) plasma or remote plasma. In some implementations, exposing the metal surface to the plasma of the reducing gas species includes exposing the metal surface to a remote hydrogen plasma.

In some implementations, treating the metal surface further includes exposing the metal surface to a cyano-based radical species. In some other implementations, treating the metal surface includes exposing the metal surface to a cyano-based radical species as an alternative to exposing the metal surface to the reducing gas species. Cyano-based radical species may perform a light etch for smoothing the metal surface prior to graphene growth. Exposing the metal surface to the cyano-based radical species can occur before or after exposing the metal surface to the plasma of the reducing gas species. This can be referred to as a multi-step pretreatment process. The multi-step pretreatment process, or at least some steps of the multi-step pretreatment process, may be performed in the same or different apparatus than the plasma processing apparatus for depositing graphene. Exposing the metal surface to the cyano-based radical species can occur simultaneous with exposing the metal surface to the plasma of the reducing gas species. This can be referred to as a single-step pretreatment process. The single-step pretreatment process may be performed in the same or different apparatus than the plasma processing apparatus for depositing graphene.

In a multi-step pretreatment process, the cyano-based radical species may be generated by igniting a plasma, where the plasma may be a direct (in-situ) plasma or a remote plasma. The cyano-based radical species may be generated from a gas mixture containing at least a carbon-containing source gas and a nitrogen-containing source gas or from a gas mixture containing a precursor having a carbon-nitrogen (CN) bond. Thus, treating the metal surface can further include generating, from at least a carbon-containing source gas and a nitrogen-containing source gas or from a precursor having a carbon-nitrogen bond, plasma containing the cyano-based radical species. For example, a gas mixture of a hydrocarbon precursor, nitrogen gas, and hydrogen gas may be supplied to a plasma generator, and plasma of the gas mixture may be ignited to form the cyano-based radical species.

In a single step pretreatment process, the cyano-based radical species may be generated by activating a downstream carbon-containing precursor. Activation of the downstream carbon-containing precursor is simultaneous with surface pretreatment by the plasma of the reducing gas species. In such instances, a remote plasma source is positioned upstream of the downstream carbon-containing precursor, where the plasma of the reducing gas species is generated in the remote plasma source. In some implementations, the downstream carbon-containing precursor may be a hydrocarbon precursor. Thus, the downstream carbon-containing precursor may be chemically the same or different than the hydrocarbon precursor used in depositing graphene. In such cases, the plasma of the reducing gas species is a plasma of a reducing gas species and of a nitrogen-containing agent. For example, the reducing gas species can include hydrogen gas. The nitrogen-containing agent can include nitrogen gas. Hence, the plasma of the reducing gas species and of the nitrogen-containing agent can be a remote $H_2$ and $N_2$ plasma. The concentration of the reducing gas species may be greater than the concentration of the nitrogen-containing agent in the plasma. Without being limited by any theory, it is believed that ions/radicals of the nitrogen-containing agent interact with the downstream carbon-containing precursor to form the cyano-based radical species. The cyano-based radical species can perform a light etch for smoothing the metal surface and the plasma of the reducing gas species can reduce metal oxides to metal on the metal surface. In some other implementations, the downstream carbon-containing precursor may be precursor gas containing one or more CN bonds. Such a precursor may be activated by the plasma of the reducing gas species, where the plasma of the reducing gas species is a remote plasma generated upstream in the remote plasma source. In some instances, the plasma of the reducing gas species is a remote hydrogen plasma. Without being limited by any theory, it is believed that ions/radicals of hydrogen interact with the downstream carbon-containing precursor having one or more CN bonds to form the cyano-based radical species.

Though the treatment operation at block 410 may be described in terms of a multi-step pretreatment process and a single step pretreatment process, it will be understood that pretreatment of the metal surface is not limited to such techniques. The metal surface of the substrate may be pretreated prior to graphene deposition using any suitable surface preparation technique known in the art.

At block 420 of the process 400, the substrate is provided in a reaction chamber, where the substrate includes the metal surface. In some implementations, the substrate may already be provided in the reaction chamber during treatment at block 410. The substrate may be a semiconductor substrate used in semiconductor applications. The metal surface can include any appropriate metal such as a transition metal. For example, the metal surface can include copper, ruthenium, nickel, molybdenum, cobalt, or combinations thereof. The metal surface can serve as a catalyst for promoting graphene nucleation and growth. Deposition of graphene may be selective to the particular metal of the metal surface. Put another way, deposition of graphene may not occur on dielectric surfaces or other non-metal surfaces.

The reaction chamber may include a substrate support or pedestal for supporting the substrate. A remote plasma source may be fluidly coupled to the reaction chamber via a showerhead. The metal surface of the substrate may be facing towards the remote plasma source. A precursor gas line may be separately fluidly coupled to the reaction chamber via one or more gas outlets. The one or more gas outlets may be located downstream from the remote plasma source. The one or more gas outlets may deliver hydrocarbon precursors into the reaction chamber and the remote plasma source may generate hydrogen radicals for delivery into the reaction chamber.

At block 430 of the process 400, one or more hydrocarbon precursors are flowed into the reaction chamber and towards the substrate. Each of the one or more hydrocarbon precursors includes an alkene or alkyne group. This means that the hydrocarbon precursors include one or more unsaturated carbon bonds, such as one or more carbon-to-carbon double bonds and/or carbon-to-carbon triple bonds. Examples of hydrocarbon precursors having alkene or alkyne groups include but are not limited to toluene, benzene, ethylene, propylene, butene, pentadiene (e.g., 1,4 pentadiene), hexene, acetylene, propyne, butyne, or pentyne. In some implementations, each of the one or more hydrocarbon precursors may include a carbon chain having at least 2 carbon atoms, at least 3 carbon atoms, at least 4 carbon atoms, at least 5 carbon atoms, at least 6 carbon atoms, or at least 7 carbon atoms.

The one or more hydrocarbon precursors may flow into the reaction chamber through the one or more gas outlets fluidly coupled to the reaction chamber. The one or more gas outlets are positioned downstream from the remote plasma source. Plasma of the one or more hydrocarbon precursors is not generated in the reaction chamber or in the remote plasma source. Rather, the one or more hydrocarbon precursors are flowed into the reaction chamber independently of plasma generated in the remote plasma source.

The one or more hydrocarbon precursors are flowed towards the substrate to adsorb onto the metal surface or at least positioned in an environment adjacent to the metal surface of the substrate. In some implementations, the one or more hydrocarbon precursors are flowed into the reaction chamber simultaneous with plasma generation and plasma exposure as described at blocks 440 and 450. In some implementations, the one or more hydrocarbon precursors are flowed into the reaction chamber prior to plasma generation and plasma exposure as described at blocks 440 and 450.

In some implementations, the one or more hydrocarbon precursors are delivered with other species, notably carrier gas, into the environment adjacent to the metal surface of the substrate. Upstream from the deposition reaction surface, the one or more hydrocarbon precursors can be mixed with an inert carrier gas. Example inert carrier gases include, but are not limited to, argon (Ar) and helium (He). In some implementations, the one or more hydrocarbon precursors are delivered as a mixture of multiple hydrocarbon precursors. The multiple hydrocarbon precursors may be present in equimolar or relatively similar proportions as appropriate to form the primary backbone or matrix in the resulting graphene. In other implementations, the relative amounts of the multiple hydrocarbon precursors are substantially skewed from equimolarity.

At block 440 of the process 400, radicals of hydrogen are generated, from a hydrogen source gas, in a remote plasma source that is positioned upstream of the one or more hydrocarbon precursors. Specifically, the radicals of hydrogen are generated in a remote plasma source that is upstream from the one or more gas outlets for introducing the one or more hydrocarbon precursors into the reaction chamber. The remote plasma source may be any suitable plasma source for plasma generation, such as an inductively-coupled plasma source or capacitively-coupled plasma source. In some implementations, the hydrogen source gas is hydrogen gas ($H_2$). In some implementations, the hydrogen gas is flowed into the remote plasma source together with one or more additional gases such as helium (He). In certain embodiments, hydrogen source gas is provided in a carrier gas such as helium. As an example, hydrogen gas may be provided in a helium carrier at a concentration of about 1-25% hydrogen or 1-10% hydrogen. Therefore, in some instances, Hz/He plasma is generated in the remote plasma source.

At block 450 of the process 400, the radicals of hydrogen are introduced into the reaction chamber and towards the substrate, where the radicals of hydrogen react with the one or more hydrocarbon precursors to deposit graphene on the metal surface of the substrate. The radicals of hydrogen are delivered into the reaction chamber under process conditions so that excited radicals transition to relaxed radicals without recombining. Pressure, fraction of carrier gas such as helium, geometry of gas ports of the showerhead, distance between the showerhead and the one or more gas outlets, and other process conditions are configured so that the hydrogen atoms encounter the substrate as radicals in a low energy state (e.g., ground state) without recombining. In some implementations, all or substantially all of the radicals of hydrogen in an environment adjacent to the substrate are radicals of hydrogen in the ground state. That way, the substrate is exposed to remote hydrogen plasma that minimizes surface growth damage.

Once generated, the radicals of hydrogen may be in an excited energy state. For example, hydrogen in an excited energy state can have an energy of at least 10.2 eV (first excited state). Excited radicals of hydrogen may cause surface growth damage of during graphene growth. In some implementations, when an excited hydrogen radical loses its energy, or relaxes, the excited hydrogen radical may become a substantially low energy state hydrogen radical or a ground state hydrogen radical. In some implementations, process conditions may be provided so that excited hydrogen radicals lose energy or relax to form substantially low energy state or ground state hydrogen radicals. For example, the remote plasma source or associated components may be designed so that a residence time of hydrogen radicals diffusing from the remote plasma source to the substrate is greater than the energetic relaxation time of an excited hydrogen radical. The energetic relaxation time for an excited hydrogen atom radical can be about equal to or less than about $1\times10^{3}$ seconds. Other process conditions that are controlled so that excited hydrogen radicals lose energy to relax to form ground state hydrogen radicals include but are not limited to pressure, gas flow rates, size and geometry of relaxation zone, size and geometry of gas ports in the showerhead, and relative concentrations of hydrogen source gas to inert carrier gas.

An environment adjacent to the metal surface of the substrate may include the one or more hydrocarbon precursors. In addition, the environment adjacent to the metal surface of the substrate may include the radicals of hydrogen in the low energy state (e g, ground state). The environment adjacent to the metal surface of the substrate comprises the metal surface as well as a space immediately above the exposed surface of the substrate. In effect, activation of the hydrocarbon precursors by radicals of hydrogen in the low energy state may occur on the metal surface or at a distance above the metal surface of the substrate. In some implementations, the distance above the metal surface of the substrate may be up to about 100 millimeters above the metal surface of the substrate. Typically, reaction conditions in the environment adjacent to the metal surface of the substrate are generally uniform across the entire metal surface of the substrate, though some variation may be permitted.

In some implementations, all, or substantially all, or a substantial fraction of the hydrogen atom radicals can be in the ground state, e.g., at least about 90% or 95% of the hydrogen atom radicals adjacent to the metal surface of the substrate are in the ground state. As used herein, radicals of hydrogen may also be referred to as "hydrogen radicals" and "hydrogen atom radicals." A state in which a substantial fraction of hydrogen atom radicals are in the ground state can be achieved by various techniques. Some apparatuses, such as described in FIG. 2, are designed to achieve this state. The process conditions for achieving hydrogen atom radicals in the ground state may not have substantial amounts of ions, electrons, or radical species in high energy states such as states above the ground state. The presence of substantial amounts of ions or high energy radicals may cause surface growth damage on the substrate, resulting in low-quality graphene or disordered carbon growth. In some implementations, the concentration of ions in the environment adjacent to the metal surface of the substrate is no greater than about $10^{7}/cm^{3}$. Hydrogen atom radicals in the ground state may provide sufficient energy for activating the one or more hydrocarbon precursors while providing mild conditions in the environment adjacent to the metal surface to limit surface growth damage.

The one or more hydrocarbon precursors are flowed into the reaction chamber downstream from the radicals of hydrogen. The radicals of hydrogen are generated in the remote plasma source located upstream from the one or more gas outlets for introducing the one or more hydrocarbon precursors. By the time the radicals of hydrogen reach the one or more hydrocarbon precursors, the radicals of hydrogen are in a low energy state or ground state upon mixing or interacting with the one or more hydrocarbon precursors.

Without being limited by any theory, one of the more kinetically favorable reaction mechanisms in the deposition reaction includes hydrogen abstraction, which results in an activated hydrocarbon precursors. Without being limited by any theory, the hydrogen radicals in the low energy state or ground state may interact with the alkyne or alkene groups in the hydrocarbon molecule that results in the formation of activated alkanes (e.g., methane). In some instances, the hydrocarbon precursor breaks down into smaller-chain hydrocarbon molecules or radicals. Activated alkanes contain at least one carbon radical as an active site, and the active sites can react together to form carbon-to-carbon bonds in graphene. Bonding at the active sites and cross-linking can form a primary backbone or matrix in a resulting graphene film. The metal surface may act as a catalyst to promote reactions between activated hydrocarbon precursors.

The hydrocarbon precursors do not serve as passive spectators, but significantly contribute to the composition of the graphene. In some implementations, substantially all or a substantial fraction of the atoms in graphene are provided by the one or more hydrocarbon precursors, with small amounts of hydrogen or other element from the remote hydrogen plasma providing less than about 5 atomic percent or less than about 2 atomic percent of the film mass. In such cases, the low energy hydrogen atom radicals used to drive the deposition reaction do not substantially contribute to the mass of the deposited graphene.

The temperature in the environment adjacent to the metal surface of the substrate can be any suitable temperature facilitating the deposition reaction. In some implementations, the temperature in the environment adjacent to the metal surface of the substrate can be largely controlled by the temperature of a pedestal on which a substrate is supported during deposition of graphene. In some implementations, the operating temperature can be equal to or less than about 500° C., equal to or less than about 450° C., equal to or less than about 400° C., equal to or less than about 350° C., equal to or less than about 300° C., between about 200° C. and about 400° C., between about 250° C. and about 400° C., or between about 200° C. and about 300° C. Such temperatures may be suitable for semiconductor applications. In some implementations, the temperature may depend on the metal of the metal surface on which the graphene is deposited. For example, copper may be able to sustain temperatures at 400° C. or below, whereas ruthenium may be able to sustain temperatures of 450° C. or below.

The pressure in the environment adjacent to the metal surface of the substrate can be any suitable pressure to promote graphene growth in the reaction chamber. In some embodiments, the pressure can be about 10 Torr or lower, or about 5 Torr or lower. For example, the pressure can be between about 1 Torr and about 2 Torr.

Graphene may be selectively deposited on the metal surface from the reaction of radicals of hydrogen with the one or more hydrocarbon precursors provided downstream from the remote plasma source. Relatively mild reaction conditions provided by the radicals of hydrogen in a low energy state (e.g., ground state) activate the one or more hydrocarbon precursors to form carbon radicals. As such, the carbon radicals are formed outside of the remote plasma source in which plasma is generated. The amount of carbon radicals at the environment adjacent to the metal surface of the substrate may be controlled to limit having too many nucleation sites for graphene growth. Without being limited by any theory, an excess number of nucleation sites may correspond to an excess number of defects during graphene growth.

Graphene may be selectively deposited on a transition metal such as copper, ruthenium, nickel, molybdenum, cobalt, or combinations thereof. In some implementations, the metal surface includes copper. In some implementations, the graphene on the metal surface is relatively thin and may be on the order of a few monolayers thick. In some implementations, the thickness of the graphene is equal to or less than about 10 nm, equal to or less than about 5 nm, equal to or less than about 3 nm, or equal to or less than about 1 nm. The thickness of the graphene may depend on the metal surface on which it is deposited on. For example, the thickness of the graphene may be less than about 1 nm when deposited on copper. The graphene may be a single layer graphene, bilayer graphene, or few layer graphene. The Raman spectrum of the graphene may be characterized by a D peak that is negligible in intensity and having a 2D peak that is equal to or greater than a G peak. It will be understood that the intensity of the D peak will be significantly smaller than the 2D peak and the G peak.

In some implementations, the process 400 may further include annealing the graphene on the metal surface of the substrate. Annealing the graphene may occur at elevated temperatures to remove defects from the graphene crystal structure. More specifically, annealing the graphene may occur at elevated temperatures greater than the deposition temperature of graphene. This ensures formation of high-quality graphene. In some implementations, the elevated temperatures may be equal to or greater than about 200° C., equal to or greater than about 250° C., equal to or greater than about 300° C., or equal to or greater than about 400° C. For example, if graphene were deposited at a temperature less than about 250° C., then annealing may occur at an elevated temperature greater than about 250° C.

Annealing the graphene may occur at a temperature range that is between the deposition temperature of graphene and a semiconductor processing temperature limit. The semiconductor processing temperature limit may be a temperature sensitive limit in which materials (e.g., metals) in the substrate would melt or otherwise be physically damaged. For example, the temperature sensitive limit of copper is about 400° C. and the temperature sensitive limit of ruthenium is about 450° C. The elevated temperature for annealing may depend on the metal in the semiconductor substrate and the temperature limits compatible with back-end-of-line semiconductor processing. Accordingly, annealing may take place at a temperature greater than the deposition temperature of graphene but at a temperature that does not exceed the semiconductor processing temperature limit. In some implementations, the temperature range for annealing the graphene is 200° C. to 450° C., 200° C. to 400° C., 250° C. to 400° C., or 300° C. to 350° C.

Annealing the graphene may result in significant improvement in the quality of graphene with reduced defects, where the D peak is decreased, the ratio between the 2D peak and the G peak is increased, and/or the ratio between the G peak and the D peak is increased. As discussed earlier, decreasing the D peak is indicative of removal of defects in the crystal structure of graphene. Increasing the ratio between the 2D peak and the G peak is indicative of the presence of single layer graphene, bilayer graphene, or few layer graphene as opposed to disordered or amorphous carbon. The higher the ratio, the higher the crystallinity of the film. For example, annealing the graphene may increase the ratio between the 2D peak and the G peak from approximately 1:1 to approximately 2:1. Furthermore, increasing the ratio between the G peak and the D peak is indicative of increased grain size. Annealing can remove any adsorbates or defects that disrupt the planar structure of graphene while increasing grain size, thereby improving film quality. In some implementations, annealing the graphene occurs in air or inert gas atmosphere, where the inert gas atmosphere includes an inert gas such as argon (Ar), helium (He), nitrogen ($N_2$), or combinations thereof. In some implementations, annealing can take place for a duration that is equal to or less than about 30 minutes, equal to or less than about 20 minutes, equal to or less than about 10 minutes, or equal to or less than about 5 minutes.

Graphene films ordinarily do not undergo annealing operations. This is because graphene is typically deposited at high temperatures, e.g., greater than about 400° C. However, when graphene is deposited at low temperatures, e.g., between about 200° C. and about 300° C., annealing may be an important step that improves graphene film quality without exceeding a temperature sensitive limit in semiconductor processing. In other words, annealing occurs within the back-end-of-line thermal budget constraints. Therefore, annealing may be an important step in integrating graphene in semiconductor processing applications. In some implementations, annealing may occur after graphene deposition but before and/or after deposition of an etch stop, diffusion barrier, or hermetic barrier.

Graphene may lower the effective resistivity of metal lines and limit electromigration. With low temperature deposition of graphene, graphene may be integrated in a process flow for manufacturing semiconductor devices, such as in back-end-of-line (BEOL) semiconductor processing. BEOL semiconductor processing may involve providing electrical interconnection between metallization layers with one or more conductive vias. During BEOL semiconductor processing, graphene may be deposited on the metallization layers or metal lines.

Graphene as an Inhibitor

Electrically conductive structures typically include line features that traverse a distance across a chip and via features that connect lines in different levels. Damascene or dual damascene processing may be used to connect lines in different levels. In order to improve semiconductor device performance, feature sizes are becoming smaller and smaller. As a result, interconnect features and vias have also shrunk. This presents many challenges during fabrication and maintaining device performance and reliability.

Generally, when connecting lines in different levels, standard deposition techniques and lithography techniques are utilized. By way of an illustration, a conventional photolithography technique defines features of an electrically conductive structure using patterning and etching processes. In these processes, a photoresist material is deposited on a substrate and then is exposed to light filtered by a reticle. The reticle is generally a glass plate that is patterned with feature geometries that block light from propagating through the reticle. After passing through the reticle, the light contacts the surface of the photoresist material and changes the chemical composition of the photoresist material such that a developer can remove a portion of the photoresist material. A developer is applied to the photoresist material to remove the portion of the photoresist material. The patterned photoresist material is used as a mask to etch underlying layers.

With shrinking feature sizes, the scaling of conventional lithography processes to provide smaller feature sizes can be difficult. This is due at least in part to alignment errors or overlay errors between features in an electrically conductive structure. Such alignment or overlay errors may also be referred to as edge placement errors. Edge placement errors invariably result during a lithography process as a mask may not be perfectly aligned with an underlying structure. For example, during light exposure stages using a reticle in a photolithography process, there can be misalignment by a few nanometers in patterning masks for vias and trenches. As a result, a via intended to connect a top metal line with a bottom metal line may be misaligned. Although edge placement errors can be minimized by reworking the lithography process, some amount of overlay errors are unavoidable.

Figure 5A:
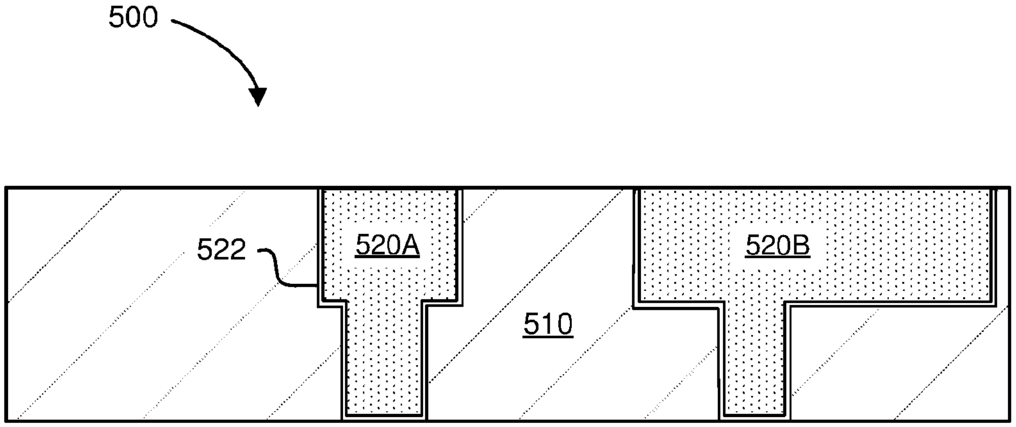
FIGS. 5A-5D show cross-sectional schematic illustrations of an example dual damascene fabrication process with a "partially landed" via.

FIGS. 5A-5D show cross-sectional schematic illustrations of an example dual damascene fabrication process with a "partially landed" via. As shown in FIG. 5A, a substrate 500 includes a first dielectric layer 510 having first metal layers 520A and 520B formed in the first dielectric layer 510, where each of the first metal layer 520A and a neighboring first metal layer 520B may extend partially or fully through the first dielectric layer 510. The substrate 500 may be a semiconductor wafer, built on a semiconductor wafer, or part of a semiconductor wafer. The first dielectric layer 510 may also be referred to as an interlayer dielectric, where the first dielectric layer 510 includes a dielectric material such as a low-k dielectric material. In some implementations, the first dielectric layer 510 includes a fluorine-doped or carbon-doped silicon oxide or an organic-containing low-k dielectric material such as an organosilicate glass (OSG). Each of the first metal layer 520A and the neighboring first metal layer 520B may include any suitable metal such as copper (Cu). Each of the first metal layer 520A and the neighboring first metal layer 520B may be lined with at least a first barrier layer 522 to limit diffusion of metal into the first dielectric layer 510. Examples of barrier layers may include but are not limited to titanium (Ti), tantalum (Ta), tantalum nitride (TaN), and titanium nitride (TiN). Though FIG. 5A shows a single layer for the first barrier layer 522, it will be understood that the first barrier layer 522 may include multiple layers such as a diffusion barrier layer and a liner layer.

Figure 5B:
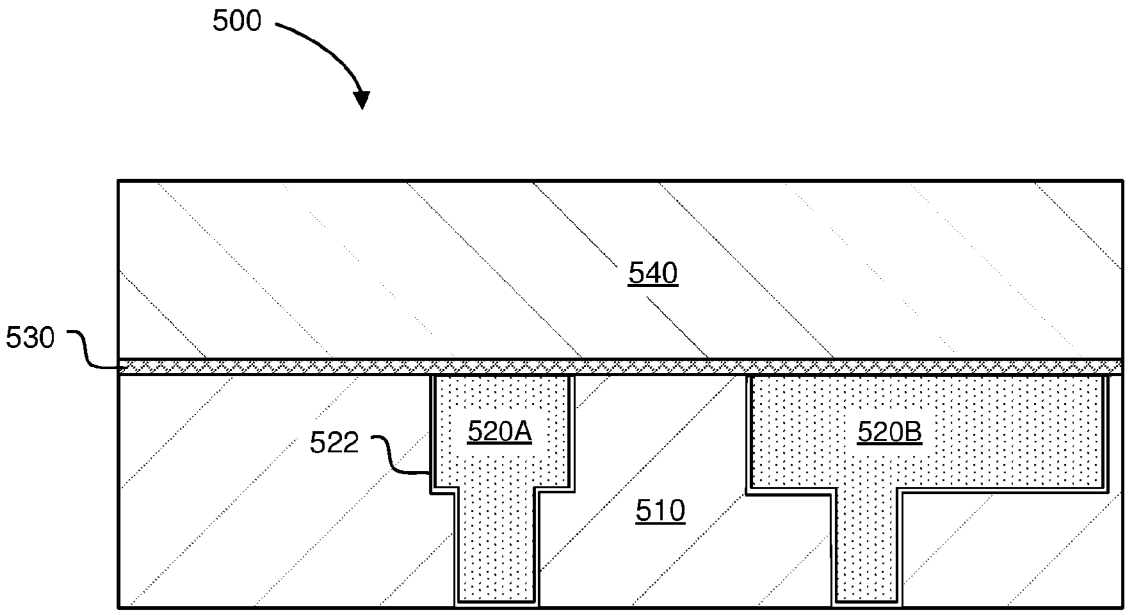

In FIG. 5B, a second dielectric layer 540 is formed over the first dielectric layer 510. In some instances, an etch stop layer 530 is positioned between the second dielectric layer 540 and the first dielectric layer 510. Though FIG. 5B shows a single layer for the etch stop layer 530, it will be understood that the etch stop layer 530 may include multiple layers such as a diffusion barrier layer and/or a liner layer.

Figure 5C:
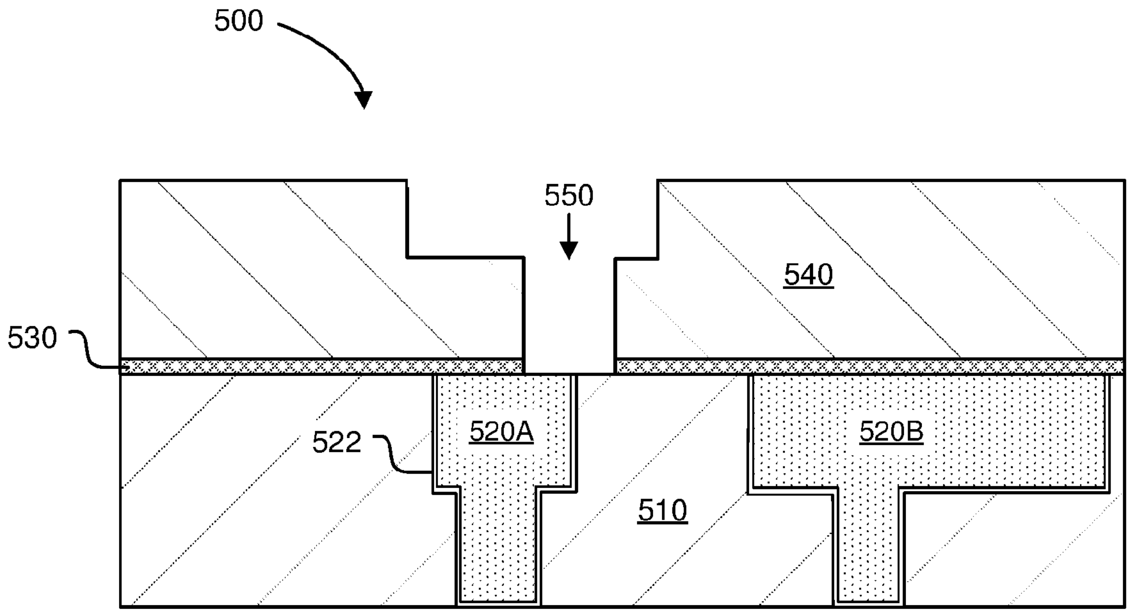

In FIG. 5C, an etch is performed to form a recess 550 through the second dielectric layer 540. The recess 550 may be formed through the second dielectric layer 540 using standard lithography techniques. The recess 550 may also be referred to as an opening, trench, contact hole, or etched feature. The recess 550 may expose a top surface of the first metal layer 520A. However, due to overlay and alignment errors discussed above, the recess 550 may partially expose a top surface of the first dielectric layer 510 in addition to the top surface of the first metal layer 520A.

Figure 5D:
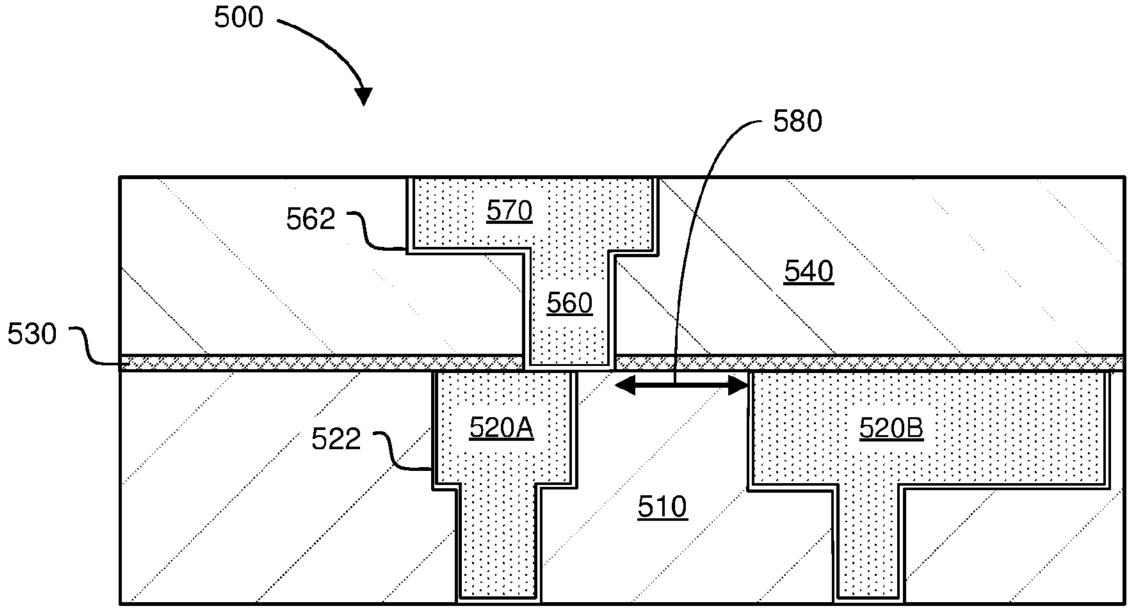

In FIG. 5D, the recess 550 is lined with a second barrier layer 562 and subsequently filled with metal to form a via 560 and a second metal layer 570. Though FIG. 5D shows a single layer for the second barrier layer 562, it will be understood that the second barrier layer 562 may include multiple layers such as a diffusion barrier layer and a liner layer. The second metal layer 570 and the via 560 are formed through the second dielectric layer 540. The second metal layer 570 and the first metal layer 520A are electrically connected to form an electrically conductive pathway through the via 560. In FIG. 5D, for example, the via 560 is shown to be misaligned with the first metal layer 520A. This kind of misalignment can be more significant as feature sizes shrink.

Due to overlay and alignment errors discussed above, the via 560 partially "lands" on the top surface of the first metal layer 520A, thereby shifting the via 560 closer to the neighboring first metal layer 520B. This leads to a reduced distance 580 between conductive features, meaning that there is less insulating space between the via 560 and the neighboring first metal layer 520B. When the via 560 partially lands on the top surface of the first dielectric layer 510, this may be referred to as an "unlanded" via. This means that the via 560 provides landed portions on the first metal layer 520A and unlanded portions outside the first metal layer 520A.

The reduced distance 580 can lead to an insufficient shorting margin and decreased time-dependent dielectric breakdown (TDDB), or even a complete short-circuit. TDDB is a failure mode whereby an insulating layer (such as the first dielectric layer 510) no longer serves as an adequate electrical insulator in typical electric fields. TDDB is dependent on the electric field between metal features as regions exposed to higher electric fields are more susceptible to TDDB failure. Higher voltages may lead to higher electric fields. TDDB is also dependent on the spacing between metal features as the spacing can be reduced to the point where the dielectric layer is incapable of withstanding the electric fields, thereby resulting in unintended conductance between the metal features. The end result is shorting or decreased reliability when the dielectric layer is incapable of supporting the operating electric field. Unlanded vias can lead to significant reliability issues because of TDDB degradation.

Figure 5E:
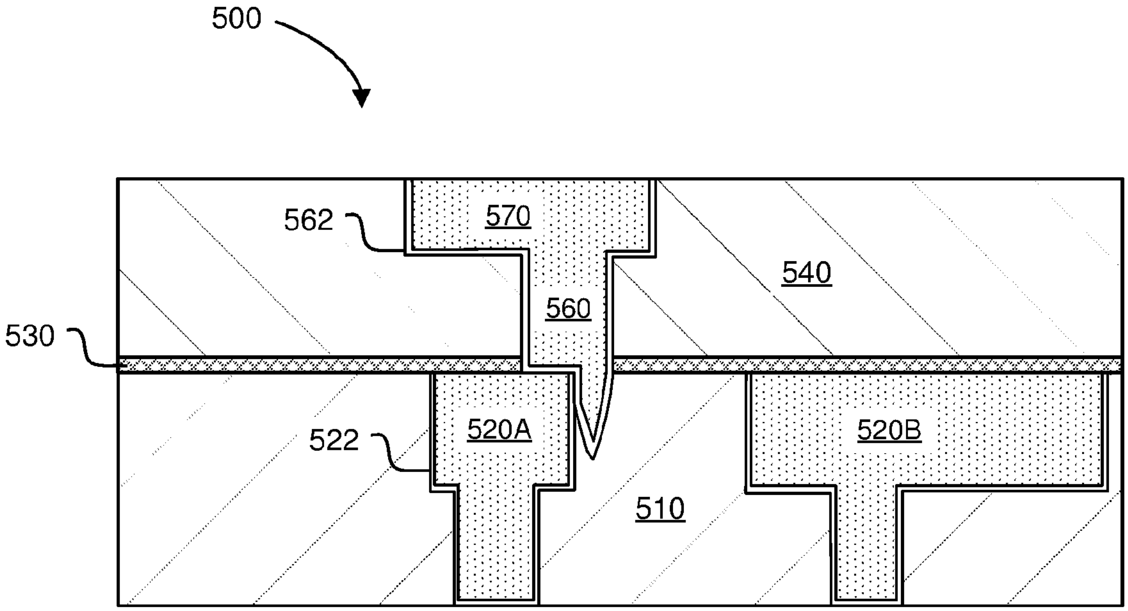
FIG. 5E shows a cross-sectional schematic illustration of an example semiconductor device having a "partially landed" via producing a tooth-shaped hole.

FIG. 5E shows a cross-sectional schematic illustration of an example semiconductor device having an "unlanded" via producing a tooth-shaped hole. In addition to TDDB degradation as a result of unlanded vias, it is possible that an over-etch may occur when forming the recess 550 in FIG. 5C. When etching proceeds through the second dielectric layer 540, misalignment may cause not only the first metal layer 520A to be exposed to etching, but also the first dielectric layer 510 to be exposed to etching. The first metal layer 520A and the first dielectric layer 510 may etch at different rates. This causes continued etching well below a local interconnection, forming a narrow channel at least partially through the first dielectric layer 510. When the narrow channel is formed at least partially through the first dielectric layer 510, a tooth-shaped hole can be produced. The tooth-shaped hole may be referred to as a "fang" or "tiger tooth" defect. The tooth-shaped hole may be lined with a barrier layer and filled with metal. This deposition in the tooth-shaped hole can lead to metal shorts, which can lead to significant RC delays, greater TDDB degradation, and possible device failure.

To address TDDB degradation and potential formation of tooth-shaped holes in a dielectric layer, a spacer layer can be deposited over the dielectric layer to increase a distance between conductive features. For example, a spacer layer (not shown) can be deposited over the first dielectric layer 510 and between the first dielectric layer 510 and the second dielectric layer 540 in FIGS. 5A-5E, thereby increasing a separation distance 580 between the via 560 and the neighboring first metal layer 520B. Increasing a thickness of the spacer layer increases the separation distance 580 to mitigate effects of TDDB degradation. In some implementations, the spacer layer may serve as an etch stop layer to prevent etching through an underlying dielectric layer. In some implementations, an etch stop layer may be deposited over the spacer layer to prevent etching through the underlying dielectric layer.

Placement of the spacer layer may assist with fully aligned via patterning. Fully aligned via patterning schemes not only align a via with a top metal layer, but also align top metal layers with bottom metal layers in an electrically conductive structure. In other words, a fully aligned via results in a via that is fully aligned with a bottom metal layer on a $M_x$ level and a top metal layer on an $M_{x+1}$ level. A fully aligned via refers to alignment in both x and y directions. No portions of the via are "unlanded" with respect to either the bottom metal layer on the $M_x$ level or the top metal layer on the $M_{x+1}$ level. A fully aligned via can contact a top surface of the first metal layer 520A ($M_x$) with no overlapping contact on a top surface of the first dielectric layer 510. The spacer layer can be selectively deposited on the top surface of the first dielectric layer 510 relative to the first metal layer 520A to prevent any such overlapping contact. The presence of the spacer layer creates a stepped topography so that the bottom metal layer on the $M_x$ level is recessed below a top surface of the spacer layer. A fully aligned via may address concerns related to TDDB degradation and formation of tooth-shaped holes caused by unlanded vias.

Formation of a spacer layer on a top surface of a dielectric layer may depend on selective deposition of the spacer layer on the top surface of the dielectric layer. That way, the spacer layer is deposited on only the top surface of the dielectric layer without depositing on the top surface of the bottom metal layer on the $M_x$ level. This prevents deposition of an insulating material on an exposed metal surface so that more surface area is available for electrical interconnection. It is possible that selective deposition of a spacer layer or other insulating layer can occur by applying an inhibitor on the exposed metal surface.

Figure 6A:
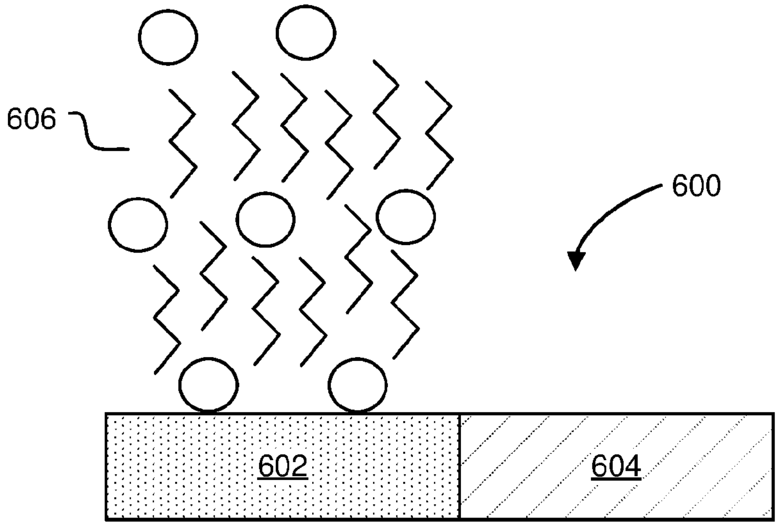
FIGS. 6A-6B show cross-sectional schematics of a process of selective deposition using a self-assembled monolayer (SAM) as an inhibitor.
Figure 6B:
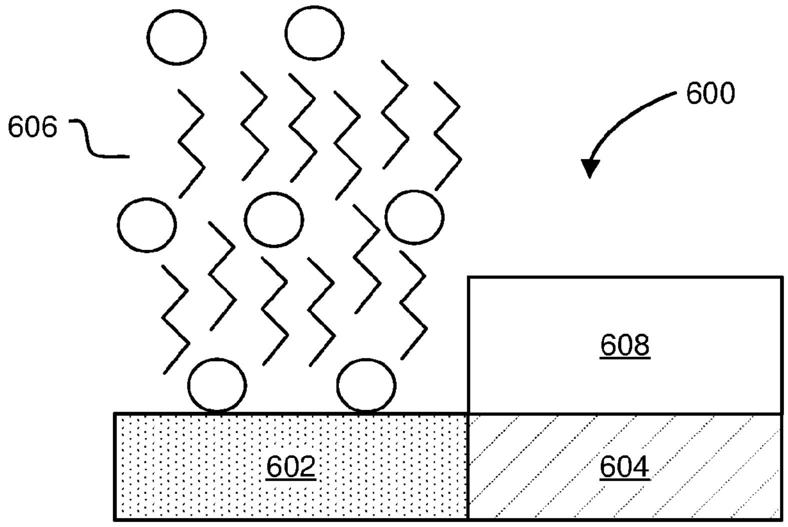

FIGS. 6A-6B show cross-sectional schematics of a process of selective deposition using a self-assembled monolayer (SAM) as an inhibitor. SAMs are molecular assemblies that include a head group, a spacer group, and a terminal group. The head group may be selected to bond with surfaces or sidewalls of certain materials, the terminal group may be functionalized for various purposes, and the spacer group may affect the thickness and density of the SAM. Example head groups include but are not limited to thiols, silanes, and phosphates. SAMs may be deposited by chemisorption onto surfaces of certain materials in a liquid or vapor phase.

In FIG. 6A, a substrate 600 includes a metal layer 602 and a dielectric layer 604 adjacent to the metal layer 602. A SAM film 606 is deposited on a top surface of the metal layer 602 in either a liquid or vapor phase. A precursor utilized to form the SAM film 606 may be selected to chemically react with the top surface of the metal layer 602 rather than with a top surface of the dielectric layer 604. As a result, the top surface of the dielectric layer 604 remains as an exposed surface for subsequent deposition of one or more materials. An entirety or substantial entirety of the top surface of the metal layer 602 is covered by the SAM film 606. The terminal group of the SAM film 606 may have a chemistry that prevents or otherwise limits deposition on the SAM film 606.

In FIG. 6B, a metal oxide 608 is selectively deposited on the dielectric layer 604. In some implementations, the metal oxide 608 is selectively deposited on the dielectric layer 604 using physical vapor deposition (PVD), atomic layer deposition (ALD), chemical vapor deposition (CVD), plasma-enhanced chemical vapor deposition (PECVD), or any other suitable deposition technique. In some implementations, the metal oxide 608 includes aluminum oxide ($Al_2O_3$), hafnium oxide ($HfO_2$), zirconium oxide ($ZrO_2$), yttrium oxide ($Y_2O_3$), zinc oxide ($ZnO_2$), or titanium oxide ($TiO_2$). The SAM film 606 inhibits deposition of the metal oxide 608 over the metal layer 602. Thus, the SAM film 606 serves as wet or dry molecular inhibitors to inhibit deposition on the SAM film 606, thereby selectively permitting deposition on the dielectric layer 604 but inhibiting deposition on the metal layer 602. In some implementations, the SAM film 606 may be optionally removed by a suitable method, such as oxygen plasma, ozone plasma, and/or acidic solution.

Using a SAM film as an inhibitor may facilitate selective deposition of one or more materials on a dielectric layer instead of a metal layer. However, employing the SAM film may reduce selectivity performance and add to processing costs and complexity. Because SAM films are typically long-chained hydrocarbons, there are challenges to having a consistent dose to chemisorb on the surface to be inhibited. In addition, SAM films generally require surface pre-treatment of the surface to be inhibited prior to deposition of the SAM films. Many SAM films are thermally unstable at elevated temperatures, so any deposition or other semiconductor integration steps performed at high temperatures may degrade the SAM films and reduce selectivity performance. Moreover, SAM films are typically not incorporated in semiconductor devices and necessitate removal after selective deposition of one or more materials on the dielectric layer.

The present disclosure selectively deposits graphene on a metal layer of a substrate, where the graphene facilitates selective deposition of a dielectric material on a dielectric layer of the substrate relative to the metal layer of the substrate. The graphene is a high-quality graphene film that serves as an inhibitor to prevent or otherwise limit deposition on the surface of the graphene and the metal layer when the dielectric material is deposited on the substrate. In some implementations, the dielectric material is metal oxide such as aluminum oxide deposited by ALD. In some implementations, the dielectric material is a spacer layer such as silicon nitride, silicon carbide, silicon carbonitride. In some implementations, the dielectric layer is a low-k dielectric material such as silicon oxycarbide, silicon carbonitride, or silicon oxycarbonitride. In some implementations, the surface of the graphene film may be subsequently modified after deposition of the dielectric material. The surface modification may permit deposition of materials such as etch stop layers and/or hermetic barriers on the graphene film.

Graphene may be selectively deposited on metal surfaces relative to dielectric surfaces. Graphene acts as an inhibitor that promotes selective deposition of materials on the dielectric surfaces while inhibiting deposition on the metal surfaces. Graphene films are generally stable at elevated temperatures. Graphene films may be incorporated during semiconductor integration since graphene films deposited on metal surfaces may lower an effective resistivity of metal lines due to reduced electron scattering. In some implementations, graphene films do not necessarily require subsequent removal in semiconductor manufacturing applications. In some other implementations, however, graphene may be removed after selective deposition of the dielectric material, and subsequent deposition operations may occur anywhere.

Figure 7:
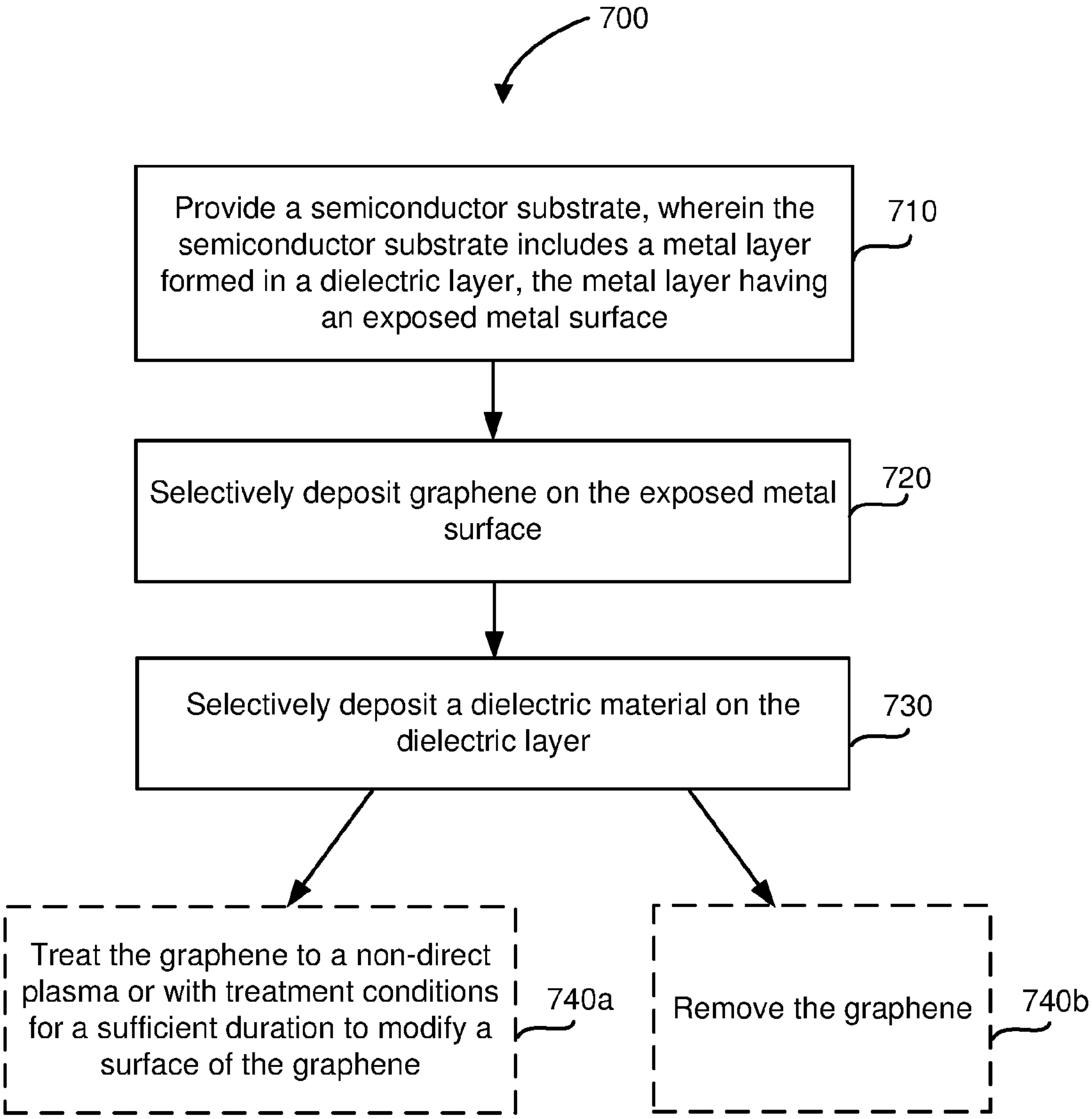
FIG. 7 illustrates a flow diagram of an example method of selective deposition using graphene according to some implementations.

FIG. 7 illustrates a flow diagram of an example method of selective deposition using graphene according to some implementations. The operations of a process 700 may be performed in different orders and/or with different, fewer, or additional operations. The operations of the process 700 are described with reference to an example process of selective deposition in FIGS. 8A-8E where graphene is used as an inhibitor. One or more operations of the process 700 may be performed using a plasma processing apparatus shown in FIG. 2. In some implementations, the operations of the process 700 may be implemented, at least in part, according to software stored in one or more non-transitory computer readable media.

At block 710 of the process 700, a semiconductor substrate is provided, where the semiconductor substrate includes a metal layer formed in a dielectric layer. The metal layer has an exposed metal surface. The semiconductor substrate may be a silicon wafer, such as a 200-mm wafer, 300-mm wafer, or a 450-mm wafer, including wafers having one or more layers of material, such as dielectric, conducting, or semiconducting materials deposited thereon. The dielectric layer may be a low-k dielectric material such as silicon oxide or doped silicon carbide. Low-k dielectric materials may have a dielectric constant equal to or less than about 4.0. In some implementations, the dielectric layer may be an ultralow-k dielectric material such as a fluorine-doped or carbon-doped silicon oxide. Ultralow-k dielectric materials may have a dielectric constant equal to or less than about 2.5. In some implementations, the metal layer may be a metallization layer in a metallization scheme, where the metal layer may include any suitable electrically conductive material such as copper, ruthenium, aluminum, nickel, cobalt, tungsten, molybdenum, or combinations thereof. In some implementations, the metal layer may be treated prior to deposition of graphene on the metal layer, where treatment may serve to at least polish the metal layer or remove impurities. For example, the exposed metal surface of the metal layer may be exposed to a reducing agent to reduce metal oxides.

Figure 8A:
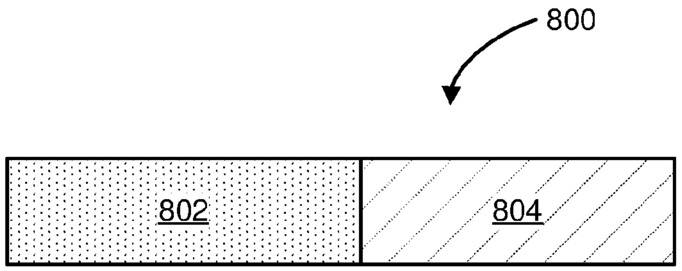
FIGS. 8A-8E show cross-sectional schematics of a process of selective deposition using graphene as an inhibitor according to some implementations.

FIG. 8A illustrates a cross-sectional schematic of an example semiconductor substrate 800 including a dielectric layer 804 adjacent to a metal layer 802. In some implementations, the metal layer 802 may be formed in the dielectric layer 804, where the dielectric layer 804 may be an interlayer dielectric for a damascene or dual damascene structure. A recess may be etched through the dielectric layer 804, where the recess may be patterned and formed using a suitable lithography process. The recess may be filled with an electrically conductive material to form the metal layer 802. In some implementations, the metal layer 802 includes copper, ruthenium, aluminum, nickel, cobalt, tungsten, molybdenum, or combinations thereof. A diffusion barrier layer and/or liner layer may be lined between the metal layer 802 and the dielectric layer 804. The diffusion barrier layer may limit diffusion of metal atoms into the dielectric layer 804. Each of the metal layer 802 and the dielectric layer 804 have exposed top surfaces.

Returning to FIG. 7, at block 720 of the process 700, graphene is selectively deposited on the exposed metal surface. The graphene is selectively deposited on the exposed metal surface relative to other surfaces, including dielectric surfaces. In some implementations, the graphene is selectively deposited on the exposed metal surface using a remote hydrogen plasma CVD process, thermal CVD process, PECVD process, or other suitable deposition process. For example, the graphene is selectively deposited on the exposed metal surface using a remote hydrogen plasma CVD process as described above.

In some implementations, the graphene deposited on the exposed metal surface is high-quality graphene. High-quality graphene serves as an effective inhibitor because of the limited number of sites on which films can nucleate. Without defective sites such as hydrogen-terminated sites or hydroxyl-terminated sites, various precursors are unable to nucleate on the surface of the graphene. For example, ALD or CVD of metal oxides may be unable to nucleate on high-quality graphene if precursors for such metal oxides are unable to adsorb on the high-quality graphene. High-quality graphene may be characterized by being free or substantially free of hydrogen-terminated sites and hydroxyl-terminated sites. High-quality graphene may be characterized by a 2D peak that is significantly greater than a G peak in a Raman spectrum, and a D peak that is negligible in the Raman spectrum. In some implementations, the 2D peak is at least two times greater than the G peak in the Raman spectrum.

Graphene may be deposited under conditions where the semiconductor substrate is maintained at a deposition temperature less than a semiconductor processing temperature limit during selective deposition of the graphene. In some implementations, the semiconductor processing temperature limit may correspond to a temperature sensitive limit of materials or components in the semiconductor substrate. For example, the temperature sensitive limit may be about 400° C. for copper and about 450° C. for ruthenium. In some implementations, the semiconductor processing temperature limit is about 400° C. Thus, the deposition temperature may be less than about 400° C., less than about 350° C., less than about 300° C., between about 200° C. and about 400° C., or between about 200° C. and about 300° C. Higher temperatures may reduce the quality of graphene. Graphene may be deposited and processed under conditions so that the graphene causes nucleation delay. Not only does deposition temperature affect the properties of graphene, but deposition time, precursor flow rate, and other parameters can influence the properties of graphene. Generally speaking, shorter deposition times and higher precursor flow rates can provide graphene with improved nucleation delay. In some implementations, graphene with nucleation delay can be provided by annealing. For instance, annealing the graphene at an elevated temperature between about 300° C. and about 450° C. (e.g., about 400° C.) for a duration between 20 seconds and 3 minutes (e.g., 1 minute) can remove functional groups and make the graphene very difficult to nucleate on.

In some implementations, the graphene may be selectively deposited on the exposed metal surface without depositing on the dielectric layer. Selectively depositing the graphene on the exposed metal surface may include flowing one or more hydrocarbon precursors into a reaction chamber and towards the semiconductor substrate, generating radicals of hydrogen in a remote plasma source from a hydrogen source gas, and introducing the radicals of hydrogen into the reaction chamber and towards the semiconductor substrate, where the radicals of hydrogen react with the one or more hydrocarbon precursors to deposit the graphene on the exposed metal surface. The one or more hydrocarbon precursors are provided downstream from the radicals of hydrogen. In some implementations, the one or more hydrocarbon precursors include an alkene or alkyne group.

Figure 8B:
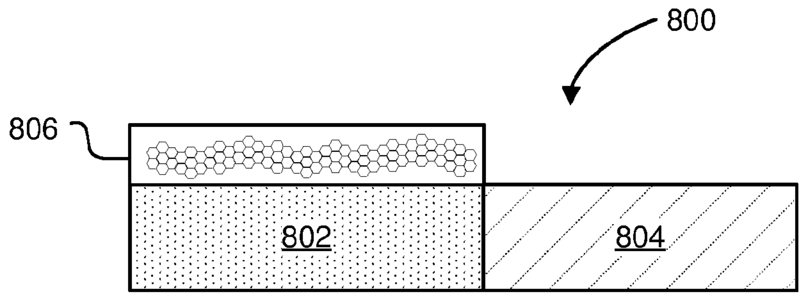

FIG. 8B illustrates a cross-sectional schematic of the semiconductor substrate 800 of FIG. 8A, where a graphene film 806 is selectively deposited on the metal layer 802. The graphene film 806 is formed on the metal layer 802 without being formed, placed, or otherwise positioned on the dielectric layer 804. The graphene film 806 may include high-quality graphene, where the graphene film 806 is a single layer graphene film, bilayer graphene film, or few layer graphene film. The graphene film 806 may be free of defective sites on which deposition precursors of dielectric materials may nucleate. The electrically conductive properties of the graphene film 806 may lower the effective resistivity of the metal layer 802 when electrically connected to a via (not shown) due to reduced electron scattering. In some implementations, the graphene film 806 may be deposited using a remote hydrogen plasma CVD process as described above. In some implementations, the graphene film 806 may be deposited at a low deposition temperature between about 200° C. and about 300° C. In some implementations, the graphene film 806 has a thickness between about 3 Å and about 20 Å or between about 5 Å and about 10 Å.

Returning to FIG. 7, at block 730 of the process 700, dielectric material is selectively deposited on the dielectric layer. The dielectric material is selectively deposited on the dielectric layer relative to other materials, including a top surface of the graphene. The graphene inhibits deposition of the dielectric material on the graphene when the dielectric material is selectively deposited on the dielectric layer. As a result, the graphene blocks deposition of the dielectric material on the metal layer. Where the graphene is removed, this allows a fully aligned via to land on the exposed metal surface. The dielectric material may have a different composition than the dielectric layer.

In some implementations, the dielectric material may be selectively deposited using any suitable deposition technique such as PVD, ALD, CVD, PECVD, or remote plasma CVD. For example, the dielectric material may be selectively deposited using ALD. After selective deposition of the dielectric material on the dielectric layer, graphene is left intact so that the top surface of the graphene remains exposed. The dielectric material may be deposited using a deposition technique that is non-damaging to the graphene. As used herein, "non-damaging" refers to processes that does not etch the graphene and that substantially maintain the crystalline nature of the graphene. With respect to a Raman spectrum characterizing the graphene, this means that the ratio of the 2D peak to G peak is increased or at least does not decrease by more than about 10%, the intensity of the G peak does not increase by more than about 10%, and the intensity of the D peak does not increase by more than about 10%.

In some implementations, the dielectric material includes a metal oxide. The metal oxide may have an etch contrast with the dielectric layer, meaning that the metal oxide provides etch selectivity that is different than the dielectric layer. In some implementations, the metal oxide may serve as an etch stop layer, where the etch stop layer has an etch contrast with surrounding materials. The metal oxide acts as a spacer that remains intact since it does not etch easily. In some implementations, the metal oxide includes aluminum oxide, hafnium oxide, zirconium oxide, yttrium oxide, zinc oxide, titanium oxide, or combinations thereof. For example, the metal oxide may include aluminum oxide. In some implementations, the aluminum oxide is deposited on the dielectric layer using a thermal-based deposition technique such as ALD. A thermal-based deposition technique may avoid damaging exposing the graphene to damaging plasmas. In some implementations, a thickness of the metal oxide is between about 5 Å and about 60 Å.

In some implementations, the dielectric material includes a low-k dielectric material. Example low-k dielectric materials include doped or undoped silicon oxide ($SiO_2$), doped or undoped silicon carbide (SiC), doped or undoped silicon nitride ($Si_3N_4$), or doped or undoped silicon carbonitride ($SiC_xN_y$). In some implementations, the low-k dielectric material includes silicon oxynitride, silicon oxycarbide, or silicon oxycarbonitride, where the low-k dielectric material may be deposited using a non-direct plasma deposition technique such as remote plasma CVD technique. Where the low-k dielectric material is deposited using the remote plasma CVD technique, the low-k dielectric material may be selectively deposited in the same reaction chamber or tool as the graphene. That way, the semiconductor substrate is not exposed to a vacuum break in between deposition operations at blocks 720 and 730.

In an example remote plasma CVD technique for depositing a low-k dielectric material, a silicon-containing precursor is flowed to the semiconductor substrate, radicals are generated in a remote plasma source from a source gas, and the radicals are introduced into a reaction chamber and flowed towards the semiconductor substrate to react with the silicon-containing precursor in the reaction chamber. In some implementations, the source gas includes a hydrogen source gas ($H_2$) and the radicals include radicals of hydrogen. The radicals are provided under processing conditions so that the radicals are in a substantially low energy state or ground state when reacting with the silicon-containing precursor in an environment adjacent to the semiconductor substrate. The radicals are generated in the remote plasma source upstream from the silicon-containing precursor. The silicon-containing precursor contains silicon-hydrogen bond(s) and/or silicon-silicon bond(s), and silicon-carbon bond(s), silicon-nitrogen bond(s), and/or silicon-oxygen bond(s). In some implementations, the silicon-containing precursor does not contain carbon-oxygen bonds or carbon-nitrogen bonds. By having the radicals generated upstream from the silicon-containing precursor and in a remote plasma source, the semiconductor substrate is not directly exposed to plasma. This avoids exposing the graphene to damaging plasmas. When the silicon-containing precursor reacts with the hydrogen radicals in the environment adjacent to the semiconductor substrate, silicon-containing material is deposited as the dielectric material on the dielectric layer.

The dielectric material may function as a spacer layer that increases a distance between a contact via and a neighboring metal layer/line. In other words, the spacer layer provides additional topography that increases spacing between the contact via and the neighboring metal layer/line, which mitigates TDDB degradation and improves device performance. Selective dielectric deposition on the dielectric layer eliminates or reduces problems associated with unlanded vias and assists with fully aligned via patterning schemes.

Figure 8C:
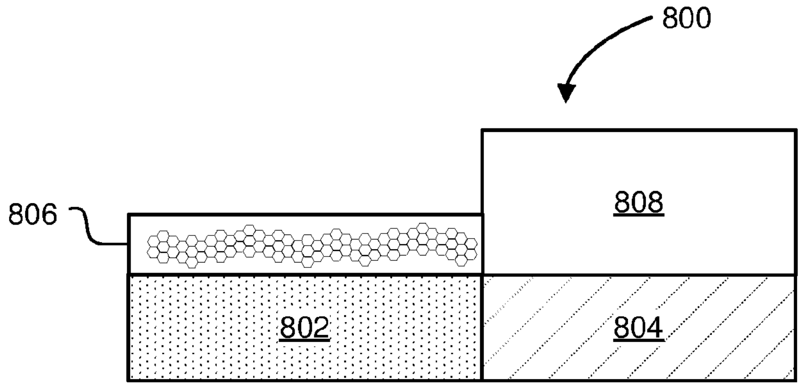

FIG. 8C illustrates a cross-sectional schematic of the semiconductor substrate 800 of FIG. 8B, where a first dielectric material 808 is selectively deposited on the dielectric layer 804. The first dielectric material 808 is deposited on the dielectric layer 804 without being formed, placed, or otherwise positioned on the top surface of the graphene film 806. The graphene film 806 inhibits deposition of the first dielectric material 808 on the metal layer 802. In some implementations, the first dielectric material 808 may be deposited in a manner that is non-damaging to the graphene film 806. In some implementations, the first dielectric material 808 may include a metal oxide such as aluminum oxide, where the metal oxide may be deposited using a thermal-based deposition technique such as ALD. In some implementations, the metal oxide may have a thickness between about 5 Å and about 60 Å. The first dielectric material 808 may serve as an etch stop layer. In some implementations, the first dielectric material 808 may include a low-k dielectric material such as silicon oxycarbide, silicon oxynitride, or silicon oxycarbonitride, where the low-k dielectric material may be deposited by a non-direct plasma deposition technique such as remote hydrogen plasma CVD. In some implementations, the low-k dielectric material may have a thickness between about 1 nm and about 10 nm. The first dielectric material 808 may serve as a spacer layer in a fully aligned patterning scheme.

Returning to FIG. 7, at block 740*a* of the process 700, the graphene may be treated with a non-direct plasma or with treatment conditions for a sufficient duration to modify a surface of the graphene. After selective deposition of the dielectric material where the graphene serves as an inhibitor, the surface of the graphene may be modified to promote subsequent deposition on the graphene. In other words, high-quality graphene may be converted to a lower-quality graphene that permits deposition of materials on the surface of the graphene. The treatment functionalizes the surface of the graphene so that nucleation may occur on the graphene.

In some implementations, the treatment includes exposing the graphene with the non-direct plasma. Exposing the graphene to direct or in-situ plasmas etches the graphene or destroys the graphene crystalline structure to form disorganized or amorphous carbon. Exposing the graphene to non-direct or remote plasmas may functionalize the surface of the graphene without etching the graphene. In some implementations, the non-direct plasma may be a remote hydrogen plasma including radicals of hydrogen (e.g., $H_2$ plasma). In some implementations, the non-direct plasma may be a remote plasma including radicals of hydrogen mixed with radicals of oxygen, ammonia, nitrogen, or combinations thereof (e.g., $H_2/O_2$ plasma). The semiconductor substrate may be maintained at a low treatment temperature during exposure to the non-direct plasma. In some implementations, the treatment temperature may be between about 20° C. and about 400° C. or between about 20° C. and about 200° C. After exposure to the non-direct plasma at the low treatment temperature, the surface of the graphene may have defective sites such as hydrogen-terminated sites or hydroxyl-terminated sites to promote nucleation and growth of subsequent material deposition on the graphene. In some implementations, the treatment at block 740*a* and the selective dielectric deposition at block 730 may be performed in the same reaction chamber or tool so that a vacuum break is not introduced between operations at blocks 730 and 740*a*.

In some implementations, the treatment includes exposing the graphene under treatment conditions for a sufficient duration. The treatment conditions may include exposing the graphene to one or more gases for an extended duration. The one or more gases may include one or both of hydrogen and oxygen. For example, the graphene may be exposed to atmospheric conditions with an air break. Without being limited by any theory, the air break may allow oxygen and/or water molecules to functionalize the surface of the graphene. In some implementations, the treatment conditions may include exposure to atmospheric pressure (760 Torr) or less, exposure to air, and exposure to approximately room temperature (between 15° C. and about 25° C.). An extended duration of at least about 2 minutes, at least about 5 minutes, at least about 10 minutes, or at least about 15 minutes is a sufficient duration to adequately functionalize the surface of the graphene. In some implementations, the treatment conditions include one or more deposition operations. The surface of the graphene may at least be partially functionalized after selectively depositing the dielectric material on the dielectric layer. Furthermore, the surface of the graphene may be more functionalized after performing additional deposition operations on the semiconductor substrate. Over an extended time or after sufficient deposition operations, enough defective sites of hydrogen-terminated sites and/or hydroxyl-terminated sites may form on the surface of the graphene to promote nucleation and growth of subsequent material deposition on the graphene.

In some implementations, the treatment conditions may cause deposition of an ultra-thin layer on graphene, where the ultra-thin layer promotes subsequent material deposition on the graphene. For example, such an ultra-thin layer can include aluminum oxide itself deposited by CVD. Or, the ultra-thin layer can include silicon carbonitride, silicon oxycarbide, or silicon nitride.

After modification of the surface of the graphene, the graphene is a lower-quality graphene film that can be characterized by a higher D peak in a Raman spectrum. In some implementations, the D peak in the Raman spectrum can increase by more than 20%. The surface modification facilitates subsequent processing steps to be performed on the graphene for semiconductor integration. Such subsequent processing steps in a process flow may entail depositing one or both of an etch stop and hermetic barrier. This can be referred to as encapsulating the graphene, where the film properties of the graphene may be maintained over time. In some implementations, an additional dielectric layer (e.g., ultralow-k dielectric) may be deposited over the etch stop and/or hermetic barrier, and a conductive via may be formed in the additional dielectric layer to provide electrical contact with the graphene in a fully aligned via patterning scheme.

Alternatively, at block 740*b* of the process 700, the graphene may be removed. In some implementations, the graphene may be removed by exposure to direct or non-direct plasma. The graphene may be selectively deposited as an inhibitor to facilitate selective deposition of the dielectric material on the dielectric layer. After selective deposition of the dielectric material on the dielectric layer, the graphene may be removed. Graphene is no longer present to act as an inhibitor. Removal of the graphene may be desirable for a fully aligned via to contact the metal layer.

Deposition may occur anywhere on the semiconductor substrate after removal of the graphene. In some implementations, a metal oxide is deposited on the exposed metal surface and the dielectric material after removal of the graphene. In some implementations, a hermetic barrier is deposited on the exposed metal surface and the dielectric material after removal of the graphene. The metal oxide or hermetic barrier may be deposited using any suitable deposition technique including plasma-based deposition techniques.

Figure 8D:
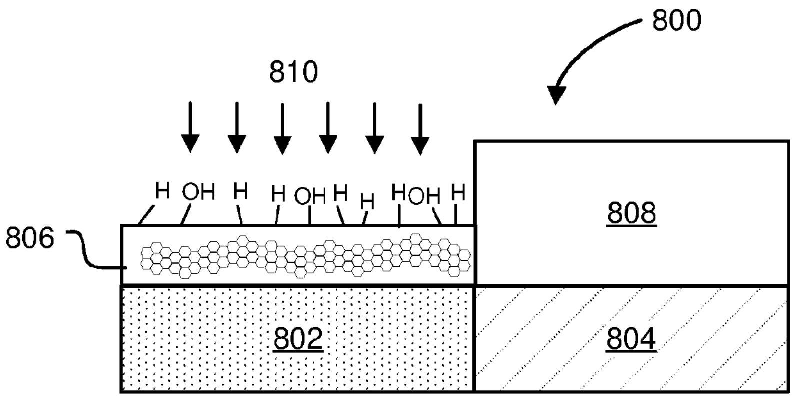

FIG. 8D illustrates a cross-sectional schematic of the semiconductor substrate 800 of FIG. 8C, where the graphene film 806 is exposed to treatment conditions 810 to cause surface modification of the graphene film 806. The modified surface of the graphene film 806 may be characterized by more defective sites for nucleation, where the defective sites may include defective sites of hydrogen-terminated sites and/or hydroxyl-terminated sites. In some implementations, the treatment conditions 810 may include exposure to remote plasma such as a remote hydrogen plasma. The remote plasma may additionally or alternatively include oxygen, nitrogen, ammonia, or combinations thereof. In some implementations, the treatment conditions 810 include exposure to one or more deposition operations. Over enough deposition operations, the surface of the graphene film 806 may eventually become functionalized so that nucleation can take place on the graphene film 806. In some implementations, the treatment conditions 810 include exposing the graphene film 806 to enough delay for the graphene film 806 to degrade in quality over time. Such treatment conditions 810 may include, for example, exposing the graphene film 806 to an air break for an extended duration. Though not shown in FIG. 8D, the graphene film 806 may alternatively be removed rather than modified. Removing the graphene film 806 may facilitate subsequent deposition anywhere on the semiconductor substrate 800 without the graphene film 806 serving as an inhibitor.

Returning to FIG. 7, the process 700 may further include depositing a metal oxide on by a thermal-based deposition technique. A thickness of metal oxide may be between about 5 Å and about 50 Å. Alternatively, the process 700 may further include depositing a hermetic barrier by a non-direct plasma deposition technique. A thickness of the hermetic barrier may be between about 5 Å and about 100 Å. The metal oxide or the hermetic barrier may be deposited on the modified surface of the graphene and the dielectric layer where the graphene remains intact. Where the graphene is removed, the metal oxide or the hermetic barrier may be deposited on the exposed metal surface and the dielectric layer.

In some implementations, the metal oxide is deposited by thermal ALD or thermal CVD. Deposition of the metal oxide may occur at a temperature below the semiconductor processing temperature limit. In some instances, deposition of the metal oxide may improve crystalline properties of the underlying graphene. The metal oxide may include aluminum oxide, hafnium oxide, zirconium oxide, yttrium oxide, zinc oxide, titanium oxide, or combinations thereof. For example, the metal oxide includes aluminum oxide. Deposition of aluminum oxide may occur by thermal ALD by introducing a dose of an aluminum-containing precursor such as trimethyl aluminum (TMA) and exposing the semiconductor substrate to an oxidant such as methanol. The metal oxide may serve as an etch stop. The metal oxide may additionally or alternatively serve as a protective layer for graphene against potentially damaging plasmas. In some implementations, where the dielectric material selectively deposited on the dielectric layer is a low-k dielectric material, the metal oxide is deposited on the low-k dielectric material and the graphene or on the low-k dielectric material and the metal layer. The metal oxide has a different etch selectivity than the low-k dielectric material, and a thickness of the low-k dielectric material is at least two times greater than a thickness of the metal oxide.

In some implementations, deposition of the metal oxide on the graphene may be followed by deposition of a hermetic barrier. The hermetic barrier may be deposited by any suitable deposition technique including non-direct and direct plasma deposition techniques. The metal oxide over the graphene may protect the graphene from exposure to damaging plasmas. Thus, the hermetic barrier may be deposited using PECVD or PEALD, where the plasma may be generated in-situ or remotely.

In some implementations, a hermetic barrier such as nitrogen-doped silicon carbide, oxygen-doped silicon carbide, or silicon nitride is deposited. Where the hermetic barrier is deposited over graphene, deposition may occur by a non-direct plasma deposition technique. The non-direct plasma deposition technique may be a remote plasma CVD technique. Where the hermetic barrier layer is deposited after removal of graphene, deposition may occur using any suitable deposition technique. The hermetic barrier may serve as an etch stop and as a hermetic barrier. In some implementations, the hermetic barrier may provide protection to the graphene by sealing the graphene from water, oxygen, and other chemistries in a surrounding environment that may adversely affect the film properties of graphene.

In a remote plasma CVD technique, a silicon-containing precursor is flowed to the semiconductor substrate in a reaction chamber, radicals are generated in a remote plasma source from a source gas, and the radicals are introduced into a reaction chamber and flowed to the semiconductor substrate to react with the silicon-containing precursor in the reaction chamber, thereby forming the hermetic barrier. In some implementations, the source gas includes hydrogen gas ($H_2$) and the radicals include hydrogen radicals. The radicals are provided under processing conditions so that the radicals are in a substantially low energy state or ground state when reacting with the silicon-containing precursor in an environment adjacent to the semiconductor substrate. The radicals are generated in the remote plasma source upstream from the silicon-containing precursor. The silicon-containing precursor contains silicon-hydrogen bond(s) and/or silicon-silicon bond(s), and silicon-carbon bond(s), silicon-nitrogen bond(s), and/or silicon-oxygen bond(s). In some implementations, the silicon-containing precursor does not contain carbon-oxygen bonds or carbon-nitrogen bonds. By having the radicals generated upstream from the silicon-containing precursor and in a remote plasma source, the semiconductor substrate is not directly exposed to plasma.

Figure 8E:
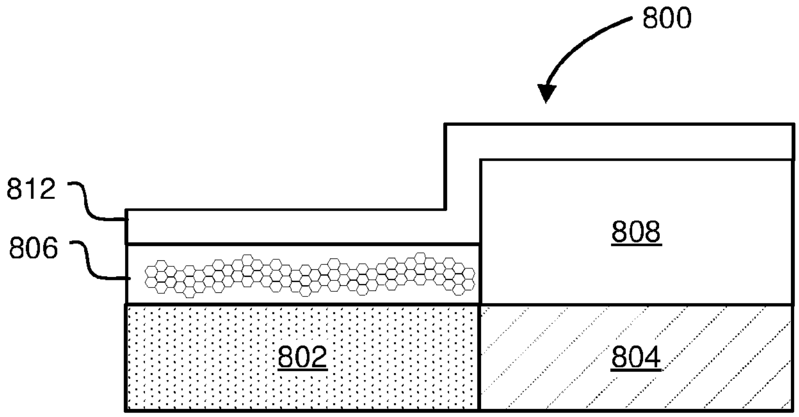

FIG. 8E illustrates a cross-sectional schematic of the semiconductor substrate 800 of FIG. 8D, where a second dielectric material 812 is deposited over the graphene film 806 and the first dielectric material 808. The graphene film 806 may be conditioned to promote deposition following the treatment conditions 810 in FIG. 8D. In some implementations, the second dielectric material 812 includes a metal oxide such as aluminum oxide, hafnium oxide, zirconium oxide, yttrium oxide, zinc oxide, titanium oxide, or combinations thereof. The metal oxide may be deposited by a thermal-based deposition technique such as thermal ALD. The metal oxide may serve as an etch stop layer. In some implementations, the second dielectric material 812 includes a hermetic barrier such as silicon oxycarbide, silicon carbonitride, or silicon oxycarbonitride. The hermetic barrier may be deposited by a non-direct plasma deposition technique such as remote hydrogen plasma CVD. The hermetic barrier may serve to encapsulate and protect the graphene film 806. It will be understood that in implementations where the graphene film 806 is removed, the second dielectric material 812 may be deposited using any suitable deposition technique. The second dielectric material 812 may be deposited over the metal layer 802 and the first dielectric material 808.

Figure 9:
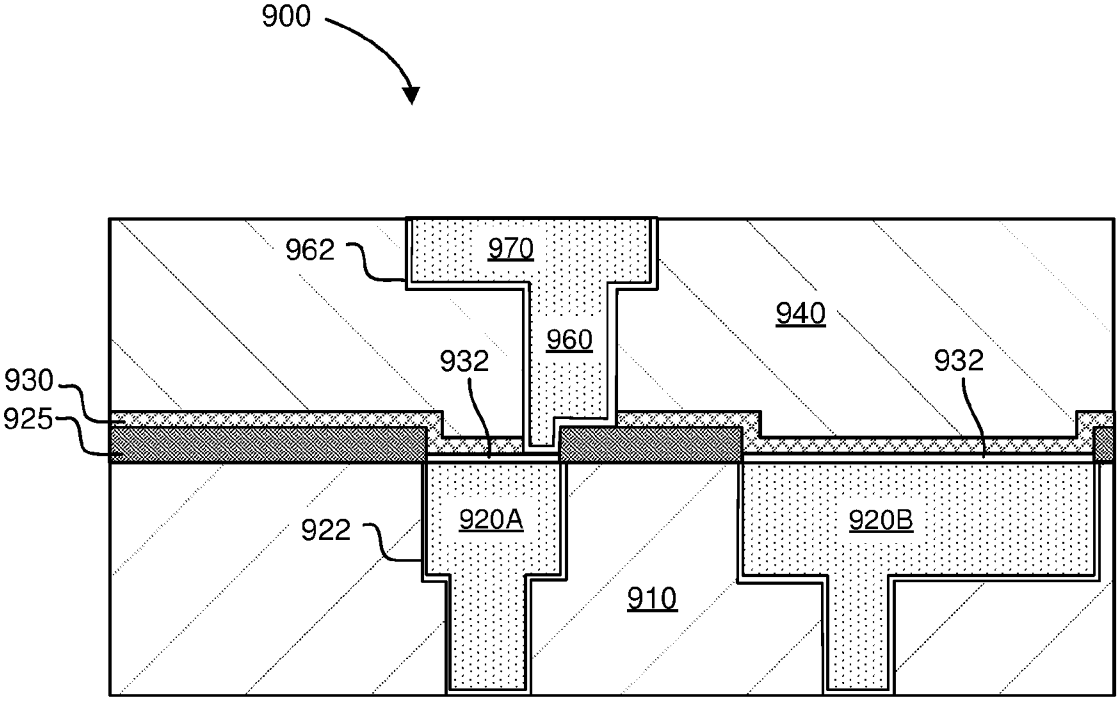
FIG. 9 shows a cross-sectional schematic illustration of an example semiconductor device having a selective graphene film and a selective dielectric layer in a dual damascene structure according to some implementations.

FIG. 9 shows a cross-sectional schematic illustration of an example semiconductor device having a graphene film and a selective dielectric layer in a dual damascene structure according to some implementations. A semiconductor device 900 includes a first dielectric layer 910 and a first metal layer 920A formed in the first dielectric layer 910. The semiconductor device 900 may further include a neighboring first metal layer 920B formed in the first dielectric layer 910, where the first metal layer 920A is adjacent to the neighboring first metal layer 920B without contacting the neighboring first metal layer 920B. Each of the first metal layer 920A and the neighboring first metal layer 920B is lined with a first barrier layer 922. The first barrier layer 922 may provide a diffusion barrier layer and/or liner layer at an interface between the first metal layer 920A and the first dielectric layer 910 as well as between the neighboring first metal layer 920B and the first dielectric layer 910.

In some implementations, each of the first metal layer 920A and the neighboring first metal layer 920B includes copper, cobalt, ruthenium, nickel, molybdenum, or combinations thereof. For example, each of the first metal layer 920A and the neighboring first metal layer 920B includes copper. In some implementations, the first dielectric layer 910 includes any suitable dielectric material such as silicon oxide or doped silicon carbide.

The semiconductor device 900 further includes a selective graphene film 932 formed on a top surface of the first metal layer 920A. The selective graphene film 932 is selectively deposited on the first metal layer 920A relative to the first dielectric layer 910. In some implementations, the selective graphene film 932 is also formed on a top surface of the neighboring first metal layer 920B. The selective graphene film 932 may have a thickness between about 3 Å and about 20 Å or between about 5 Å and about 10 Å. The selective graphene film 932 is deposited on the top surface of the first metal layer 920A by flowing one or more hydrocarbon precursors toward the semiconductor device 900, generating from a hydrogen source gas radicals of hydrogen in a remote plasma source, and introducing the radicals of hydrogen toward the semiconductor device 900, where the radicals of hydrogen are introduced upstream from the one or more hydrocarbon precursors, where the radicals of hydrogen react with the one or more hydrocarbon precursors in an environment adjacent to at least the first metal layer 920A to deposit the selective graphene film 932. The one or more hydrocarbon precursors may each include an alkene or alkyne group. In some instances, the hydrogen source gas may be provided in a helium carrier at a concentration of about 1-25% hydrogen or about 1-10% hydrogen. The selective graphene film 932 is deposited at a low deposition temperature, where the low deposition temperature may be between about 200° C. and about 400° C., between about 250° C. and about 400° C., or between about 200° C. and about 300° C.

The semiconductor device 900 further includes a selective dielectric layer 925 formed on a top surface of the first dielectric layer 910. The selective dielectric layer 925 is selectively deposited on the first dielectric layer 910 relative to the first metal layer 920A and the neighboring first metal layer 920B. The selective dielectric layer 925 may have a thickness between about 1 nm and about 10 nm. In some implementations, the selective dielectric layer 925 includes a low-k dielectric material such as silicon oxynitride, silicon oxycarbide, or silicon oxycarbonitride. In some implementations, the selective dielectric layer 925 is deposited on the first dielectric layer 910 using a non-direct plasma deposition technique such as remote hydrogen plasma CVD.

In some implementations, the semiconductor device 900 further includes an etch stop layer 930 over the selective dielectric layer 925 and the selective graphene film 932, where the etch stop layer 930 includes a metal oxide. Examples of metal oxides include aluminum oxide, hafnium oxide, zirconium oxide, yttrium oxide, zinc oxide, titanium oxide, or combinations thereof. In some implementations, the etch stop layer 930 includes aluminum oxide. The etch stop layer 930 may have a thickness between about 5 Å and about 30 Å. In some implementations, the etch stop layer 930 is deposited over the selective dielectric layer 925 and the selective graphene film 932 using a thermal deposition technique such as thermal ALD or thermal CVD.

The semiconductor device 900 may further include a second dielectric layer 940 over the etch stop layer 930. The second dielectric layer 940 includes any suitable dielectric material such as silicon oxide or doped silicon carbide. The etch stop layer 930 may have an etch selectivity different than the second dielectric layer 940. For example, the etch stop layer 930 may have an etch resistance equal to or greater than ten times an etch resistance of the second dielectric layer 940 when one or more recesses are formed in the second dielectric layer 940. That way, etching through the second dielectric layer 940 does not result in etching the selective graphene film 932. The selective dielectric layer 925 may have an etch selectivity different than the etch stop layer 930.

A recess or opening is formed through the second dielectric layer 940 and filled with an electrically conductive material to form a via 960 and a second metal layer 970 over the via 960. The second metal layer 970 is positioned over the first metal layer 920A, and the via 960 is positioned between the selective graphene film 932 and the second metal layer 970. The via 960 provides electrical interconnection between the first metal layer 920A and the second metal layer 970. The via 960 and the second metal layer 970 may be lined with a second barrier layer 962. The second barrier layer 962 may provide a diffusion barrier layer and/or liner layer at an interface between the via 960 and the second dielectric layer 940 as well as between the neighboring second metal layer 970 and the second dielectric layer 940. In some implementations, each of the via 960 and the second metal layer 970 includes copper, cobalt, ruthenium, nickel, molybdenum, or combinations thereof. For example, each of the via 960 and the second metal layer 970 includes copper.

As shown in FIG. 9, the selective graphene film 932 is positioned at an interface between the via 960 and the first metal layer 920A. The selective graphene film 932 serves as an inhibitor so that the selective dielectric layer 925 is deposited on the first dielectric layer 910 relative to the first metal layer 920A and the neighboring first metal layer 920B. The selective graphene film 932 is not removed after the selective dielectric layer 925 is deposited. The selective graphene film 932 lowers an electrical resistance at the via 960 because of reduced electron scattering. The selective dielectric layer 925 ensures that the via 960 is a fully aligned via, and the selective dielectric layer 925 provides additional spacing between the via 960 and the neighboring first metal layer 920B.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of selective deposition on a dielectric layer, the method comprising:

providing a semiconductor substrate, wherein the semiconductor substrate comprises a metal layer formed in a dielectric layer, the metal layer having an exposed metal surface;

selectively depositing graphene on the exposed metal surface;

selectively depositing a dielectric material on the dielectric layer, wherein the dielectric material comprises a low-k dielectric material; and depositing a metal oxide on the low-k dielectric material and the graphene, wherein the metal oxide has a different etch selectivity than the low-k dielectric material and a thickness of the low-k dielectric material is at least two times greater than a thickness of the metal oxide.

2. The method of claim 1, wherein a surface of the graphene is free of hydrogen-terminated sites and hydroxyl-terminated sites.

3. The method of claim 1, wherein the graphene inhibits deposition of the dielectric material on the graphene when the dielectric material is selectively deposited on the dielectric layer.

4. The method of claim 1, wherein the dielectric material comprises a metal oxide.

5. The method of claim 1, wherein the metal layer comprises copper, cobalt, ruthenium, nickel, molybdenum, or combinations thereof.

6. The method of claim 1, further comprising:

exposing the graphene to a non-direct plasma to modify a surface of the graphene; and depositing a metal oxide on the modified surface of the graphene and the dielectric material by a thermal-based deposition technique.

7. The method of claim 1, further comprising:

removing the graphene; and depositing a metal oxide on the exposed metal surface and the dielectric material.

8. The method of claim 1, further comprising:

exposing the graphene to a non-direct plasma to modify a surface of the graphene; and depositing a hermetic barrier on the modified surface of the graphene and the dielectric material by a non-direct plasma deposition technique.

9. The method of claim 8, wherein the non-direct plasma comprises radicals of hydrogen mixed with radicals of oxygen, ammonia, nitrogen, or combinations thereof.

10. The method of claim 1, further comprising:

removing the graphene; and depositing a hermetic barrier on the exposed metal surface and the dielectric material.

11. The method of claim 1, wherein selectively depositing the graphene on the exposed metal surface comprises:

flowing one or more hydrocarbon precursors into a reaction chamber and towards the semiconductor substrate;

generating, from a hydrogen source gas, radicals of hydrogen in a remote plasma source; and introducing the radicals of hydrogen into the reaction chamber and towards the semiconductor substrate, wherein the radicals of hydrogen react with the one or more hydrocarbon precursors to deposit the graphene on the exposed metal surface.

12. A method of selective deposition on a dielectric layer, the method comprising:

providing a semiconductor substrate, wherein the semiconductor substrate comprises a metal layer formed in a dielectric layer, the metal layer having an exposed metal surface;

selectively depositing graphene on the exposed metal surface;

selectively depositing a dielectric material on the dielectric layer;

exposing the graphene to a non-direct plasma to modify a surface of the graphene; and deposit a metal oxide on the modified surface of the graphene and the dielectric material by a thermal-based deposition technique.

13. A method of selective deposition on a dielectric layer, the method comprising:

providing a semiconductor substrate, wherein the semiconductor substrate comprises a metal layer formed in a dielectric layer, the metal layer having an exposed metal surface;

selectively depositing graphene on the exposed metal surface;

selectively depositing a dielectric material on the dielectric layer;

removing the graphene; and depositing a metal oxide on the exposed metal surface and the dielectric material.

* * * * *